(12) United States Patent
Wang et al.

(10) Patent No.: US 12,183,276 B2
(45) Date of Patent: Dec. 31, 2024

(54) DISPLAY SUBSTRATE WITH PIXEL CIRCUIT CONTAINING MULTIPLE LIGHT-EMITTING ELEMENTS, METHOD FOR DRIVING DISPLAY SUBSTRATE, AND DISPLAY DEVICE

(71) Applicant: BOE TECHNOLOGY GROUP CO., LTD., Beijing (CN)

(72) Inventors: Tangxiang Wang, Beijing (CN); Fei Yang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/756,697

(22) PCT Filed: Apr. 27, 2021

(86) PCT No.: PCT/CN2021/090282
§ 371 (c)(1),
(2) Date: May 31, 2022

(87) PCT Pub. No.: WO2022/226785
PCT Pub. Date: Nov. 3, 2022

(65) Prior Publication Data
US 2024/0203342 A1  Jun. 20, 2024

(51) Int. Cl.
*G09G 3/3233* (2016.01)
(52) U.S. Cl.
CPC ... *G09G 3/3233* (2013.01); *G09G 2300/0852* (2013.01); *G09G 2310/08* (2013.01); *G09G 2330/021* (2013.01)

(58) Field of Classification Search
CPC ......... G09G 3/3233; G09G 2300/0852; G09G 2310/08; G09G 2330/021;
(Continued)

(56) References Cited

U.S. PATENT DOCUMENTS 8,040,302 B2  10/2011  Shin
9,542,873 B2  1/2017  Yu et al.
(Continued)

FOREIGN PATENT DOCUMENTS

CN  1702711 A  11/2005
CN  105206208 A  12/2015
(Continued)

OTHER PUBLICATIONS

The extended European Search Report dated Feb. 29, 2024; Appln. No. 21938272.8.

*Primary Examiner* — Rodney Amadiz

(57) ABSTRACT

A display substrate, a method for driving a display substrate, and a display device are provided. The display substrate includes a plurality of pixel units and a plurality of pixel circuits. The plurality of pixel units are divided into a plurality of groups, and each pixel circuit is configured to drive a corresponding group of pixel units. Each pixel circuit includes a driving circuit, a data writing circuit, a storage circuit, a sensing circuit, and a light-emitting control circuit. The light-emitting control circuit is respectively connected to light-emitting elements of a corresponding group of pixel units, and the light-emitting control circuit is configured to apply a driving current to the light-emitting elements of respective pixel units of the group of pixel units at different times in response to at least two light-emitting control signals.

18 Claims, 19 Drawing Sheets

(58) Field of Classification Search
CPC ... G09G 2300/0804; G09G 2300/0842; G09G 2300/0861; H10K 59/131
See application file for complete search history.

(56) References Cited

U.S. PATENT DOCUMENTS

| | | | |
|---|---|---|---|
| 10,546,530 | B2 | 1/2020 | Lee |
| 10,672,346 | B2 | 6/2020 | Kang |
| 11,017,710 | B2 | 5/2021 | Xue et al. |
| 11,341,917 | B2 | 5/2022 | Shim et al. |
| 2008/0170029 | A1 | 7/2008 | Kim |
| 2019/0103060 | A1* | 4/2019 | Kang .................. G09G 3/3266 |
| 2020/0143740 | A1 | 5/2020 | Tsuboi et al. |
| 2021/0134917 | A1* | 5/2021 | Li ....................... G09G 3/3266 |

FOREIGN PATENT DOCUMENTS

| | | | |
|---|---|---|---|
| CN | 106531110 | A | 3/2017 |
| CN | 107911522 | A | 4/2018 |
| CN | 109599057 | A | 4/2019 |
| CN | 109658866 | A | 4/2019 |
| CN | 110503917 | A | 11/2019 |
| CN | 111243496 | A | 6/2020 |
| CN | 111583873 | A | 8/2020 |
| CN | 112669760 | A | 4/2021 |
| EP | 3 462 436 | A1 | 4/2019 |
| EP | 3 783 592 | A1 | 2/2021 |

\* cited by examiner

DISPLAY SUBSTRATE WITH PIXEL CIRCUIT CONTAINING MULTIPLE LIGHT-EMITTING ELEMENTS, METHOD FOR DRIVING DISPLAY SUBSTRATE, AND DISPLAY DEVICE

TECHNICAL FIELD

Embodiments of the present disclosure relate to a display substrate, a method for driving a display substrate, and a display device.

BACKGROUND

With the rise of smart wear, virtual reality, augmented reality and other devices, consumers' demand for the performance of small-sized display panels on product devices is constantly increasing, such as the demand for brightness, size, power consumption and other indicators increases. The miniaturization light-emitting diode (MicroLED) technology is a new display technology. The structure of the light-emitting diode (LED) is thinned and miniaturized on a base substrate by a miniaturization process technology, and the size of each LED unit is about 1~10 microns. Then, the arrayed LED units are transferred to a circuit board in batches by huge transfer technology, and positive and negative grid electrodes which are vertically staggered are connected to positive and negative electrodes of the LED units in turn, and then they are turned on and imaged by scanning, so as to realize individual address of each pixel and to be driven to emit light independently. With the progress of product technology and the optimization of cost, energy-saving, high-efficiency, stable and small-sized MicroLED can be extended to applications, such as ultra-high-resolution large-screen displays, automobiles, etc.

Micro-display technology of silicon-based organic light-emitting diode (OLED), that is, the miniaturization OLED technology, is still driven by the injection and recombination of carriers, and the micro-display technology retains the characteristics of OLED, such as low power consumption, fast response speed, wide viewing angle, high resolution, etc. On this basis, the silicon-based OLED also uses a single-crystal silicon base substrate technology of liquid crystal on silicon (LCOS), which achieves higher light utilization efficiency than the light utilization efficiency of a glass base substrate, and the light utilization efficiency can reach more than 40%. Under the miniaturization process, the silicon-based OLED display panel can achieve the characteristics, such as high pixels per inch (PPI), small size, portability, etc.

SUMMARY

At least one embodiment of the present disclosure provides a display substrate, which comprises: a base substrate, a plurality of pixel units on the base substrate, and a plurality of pixel circuits on the base substrate. The plurality of pixel units are arranged in a plurality of rows and columns, and the plurality of pixel units are divided into a plurality of groups, each group of pixel units comprises at least two pixel units, and each pixel unit comprises a light-emitting element: each pixel circuit is configured to drive a corresponding group of pixel units, and each pixel circuit comprises a driving circuit, a data writing circuit, a storage circuit, a sensing circuit, and a light-emitting control circuit; the driving circuit is connected to the data writing circuit, the storage circuit, the sensing circuit, and the light-emitting control circuit, respectively, and is configured to control a value of a driving current: the data writing circuit is configured to write a data signal into the driving circuit in response to a first scanning signal: the storage circuit is configured to store the data signal written by the data writing circuit: the sensing circuit is configured to connect the driving circuit to a sensing signal line in response to a second scanning signal; the light-emitting control circuit is connected to the driving circuit and is respectively connected to at least two light-emitting elements of at least two pixel units of a corresponding group of pixel units, and the light-emitting control circuit is configured to apply the driving current to light-emitting elements of respective pixel units of the corresponding group of pixel units at different times in response to at least two light-emitting control signals: and the light-emitting element is configured to emit light according to the driving current that is received.

For example, in the display substrate provided by an embodiment of the present disclosure, an amount of pixel units comprised in each group of pixel units is N, N is a positive integer, the light-emitting control circuit comprises N light-emitting control sub-circuits, and the at least two light-emitting control signals comprise N light-emitting control signals, each light-emitting control sub-circuit is connected to a light-emitting element of one pixel unit in the corresponding group of pixel units, each light-emitting control sub-circuit receives one light-emitting control signal of the N light-emitting control signals, different light-emitting control sub-circuits are connected to light-emitting elements of different pixel units in the corresponding group of pixel units, and different light-emitting control sub-circuits receive different light-emitting control signals.

For example, in the display substrate provided by an embodiment of the present disclosure, the driving circuit comprises a control terminal, a first terminal, and a second terminal, and the first terminal of the driving circuit receives a first voltage of a first voltage terminal: the data writing circuit is connected to the control terminal of the driving circuit, a first terminal of the storage circuit is connected to the control terminal of the driving circuit, a second terminal of the storage circuit is connected to the first terminal of the driving circuit, the sensing circuit is connected to the second terminal of the driving circuit, and the light-emitting control circuit is connected to the second terminal of the driving circuit: and a first terminal of the light-emitting element is connected to the light-emitting control circuit, and a second terminal of the light-emitting element receives a second voltage of a second voltage terminal.

For example, in the display substrate provided by an embodiment of the present disclosure, the data writing circuit comprises a first transistor, the sensing circuit comprises a second transistor, the driving circuit comprises a third transistor, and the storage circuit comprises a storage capacitor: a gate electrode of the third transistor serves as the control terminal of the driving circuit, a first electrode of the third transistor serves as the first terminal of the driving circuit, and a second electrode of the third transistor serves as the second terminal of the driving circuit: a gate electrode of the first transistor is connected to a first scanning line to receive the first scanning signal, a first electrode of the first transistor is connected to a data line to receive the data signal, and a second electrode of the first transistor is connected to the gate electrode of the third transistor: a gate electrode of the second transistor is connected to a second scanning line to receive the second scanning signal, a first electrode of the second transistor is connected to the second electrode of the third transistor, and a second electrode of the second transistor is connected to the sensing signal line: and a first electrode of the storage capacitor serves as the first terminal of the storage circuit, and a second electrode of the storage capacitor serves as the second terminal of the storage circuit.

For example, in the display substrate provided by an embodiment of the present disclosure, each light-emitting control sub-circuit comprises a light-emitting control transistor, a gate electrode of the light-emitting control transistor is connected to a corresponding light-emitting control signal line to receive a corresponding light-emitting control signal, a first electrode of the light-emitting control transistor is connected to the second electrode of the third transistor, and a second electrode of the light-emitting control transistor is connected to a corresponding light-emitting element.

For example, in the display substrate provided by an embodiment of the present disclosure, the storage capacitor comprises two capacitor plates which are stacked, one of the two capacitor plates serves as the first electrode of the storage capacitor and the other of the two capacitor plates serves as the second electrode of the storage capacitor; and an orthographic projection of at least one of the two capacitor plates on the base substrate at least partially covers an orthographic projection of the first transistor on the base substrate, and at least partially covers an orthographic projection of the second transistor on the base substrate.

For example, in the display substrate provided by an embodiment of the present disclosure, the orthographic projection of the first transistor on the base substrate at least comprises an orthographic projection of an active layer of the first transistor on the base substrate, and the orthographic projection of the second transistor on the base substrate at least comprises an orthographic projection of an active layer of the second transistor on the base substrate.

For example, in the display substrate provided by an embodiment of the present disclosure, the orthographic projection of at least one of the two capacitor plates on the base substrate at least partially covers an orthographic projection of the third transistor on the base substrate.

For example, in the display substrate provided by an embodiment of the present disclosure, the orthographic projection of the first transistor on the base substrate and the orthographic projection of the second transistor on the base substrate are on different sides of an orthographic projection of the third transistor on the base substrate.

For example, in the display substrate provided by an embodiment of the present disclosure, the orthographic projection of at least one of the two capacitor plates on the base substrate at least partially covers an orthographic projection of the light-emitting control transistor on the base substrate.

For example, in the display substrate provided by an embodiment of the present disclosure, the two capacitor plates comprise a first capacitor plate and a second capacitor plate, and an orthographic projection of the second capacitor plate on the base substrate covers an orthographic projection of the first capacitor plate on the base substrate: the first capacitor plate is connected to a first transfer electrode through a first group of via holes, and an orthographic projection of the first transfer electrode on the base substrate and orthographic projections of the first group of via holes on the base substrate are all located within the orthographic projection of the first capacitor plate on the base substrate; and the second capacitor plate is connected to a second transfer electrode through a second group of via holes, and an orthographic projection of the second transfer electrode on the base substrate and orthographic projections of the second group of via holes on the base substrate are all located within the orthographic projection of the second capacitor plate on the base substrate, and do not overlap with the orthographic projection of the first capacitor plate on the base substrate.

For example, in the display substrate provided by an embodiment of the present disclosure, there is a gap between the orthographic projection of the second transfer electrode on the base substrate and the orthographic projection of the first capacitor plate on the base substrate.

For example, in the display substrate provided by an embodiment of the present disclosure, the N light-emitting control sub-circuits comprise a first light-emitting control sub-circuit, a second light-emitting control sub-circuit, a third light-emitting control sub-circuit, and a fourth light-emitting control sub-circuit: the first light-emitting control sub-circuit comprises a first light-emitting control transistor, the second light-emitting control sub-circuit comprises a second light-emitting control transistor, the third light-emitting control sub-circuit comprises a third light-emitting control transistor, and the fourth light-emitting control sub-circuit comprises a fourth light-emitting control transistor: the first light-emitting control transistor, the second light-emitting control transistor, the third light-emitting control transistor, and the fourth light-emitting control transistor are distributed along a first direction; and a first via hole connected to a gate electrode of the first light-emitting control transistor, a second via hole connected to a gate electrode of the second light-emitting control transistor, a third via hole connected to a gate electrode of the third light-emitting control transistor, and a fourth via hole connected to a gate electrode of the fourth light-emitting control transistor are not on a same straight line extending along the first direction.

For example, in the display substrate provided by an embodiment of the present disclosure, a first electrode of the first light-emitting control transistor and a second electrode of the first light-emitting control transistor, a first electrode of the second light-emitting control transistor and a second electrode of the second light-emitting control transistor, a first electrode of the third light-emitting control transistor and a second electrode of the third light-emitting control transistor, and a first electrode of the fourth light-emitting control transistor and a second electrode of the fourth light-emitting control transistor are all on a same extension line extending along the first direction, and the first via hole, the second via hole, the third via hole, and the fourth via hole are alternately on both sides of the extension line.

For example, in the display substrate provided by an embodiment of the present disclosure, the gate electrode of the first transistor, the gate electrode of the second transistor, and the gate electrode of the third transistor are on a same distribution line extending along the first direction, and the distribution line and the extension line are parallel to each other with a gap.

For example, in the display substrate provided by an embodiment of the present disclosure, the data line and the sensing signal line are spaced apart from each other and extend in a second direction on the base substrate, and the second direction is perpendicular to the first direction; and an orthographic projection of the data line on the base substrate and an orthographic projection of the sensing signal line on the base substrate are on different sides of an orthographic projection of the third transistor on the base substrate.

For example, in the display substrate provided by an embodiment of the present disclosure, the orthographic projection of the data line on the base substrate is between the orthographic projection of the first transistor on the base substrate and the orthographic projection of the third transistor on the base substrate: and the orthographic projection of the sensing signal line on the base substrate is between the orthographic projection of the second transistor on the base substrate and the orthographic projection of the third transistor on the base substrate.

For example, in the display substrate provided by an embodiment of the present disclosure, a length of a current flow path between the second light-emitting control transistor and a corresponding light-emitting element and a length of a current flow path between the third light-emitting control transistor and a corresponding light-emitting element are greater than a length of a current flow path between the first light-emitting control transistor and a corresponding light-emitting element and a length of a current flow path between the fourth light-emitting control transistor and a corresponding light-emitting element.

For example, in the display substrate provided by an embodiment of the present disclosure, the first light-emitting control transistor is connected to the corresponding light-emitting element through a first transfer line, the second light-emitting control transistor is connected to the corresponding light-emitting element through a second transfer line, the third light-emitting control transistor is connected to the corresponding light-emitting element through a third transfer line, and the fourth light-emitting control transistor is connected to the corresponding light-emitting element through a fourth transfer line: and the first transfer line and the fourth transfer line are distributed axially symmetrically, and the second transfer line and the third transfer line are distributed axially symmetrically.

For example, in the display substrate provided by an embodiment of the present disclosure, the first transfer line, the second transfer line, the third transfer line, and the fourth transfer line are all L-shaped traces.

For example, in the display substrate provided by an embodiment of the present disclosure, a L-shaped trace of the L-shaped traces comprises a first section extending along the first direction and a second section extending along a second direction, and the second direction is perpendicular to the first direction: an orthographic projection of the first section on the base substrate does not overlap with orthographic projections of the capacitor plates on the base substrate: and an orthographic projection of the second segment on the base substrate overlaps with the orthographic projections of the capacitor plates on the base substrate.

For example, in the display substrate provided by an embodiment of the present disclosure, the first transfer line is connected to the corresponding light-emitting element through a fifth via hole, and the fifth via hole is within the first section of the first transfer line: the second transfer line is connected to the corresponding light-emitting element through a sixth via hole, and the sixth via hole is within the first section of the second transfer line; the third transfer line is connected to the corresponding light-emitting element through a seventh via hole, and the seventh via hole is within the first section of the third transfer line: and the fourth transfer line is connected to the corresponding light-emitting element through an eighth via hole, and the eighth via hole is within the first section of the fourth transfer line.

For example, in the display substrate provided by an embodiment of the present disclosure, a length of the first section of the second transfer line and a length of the first section of the third transfer line are equal and both are a first length, a length of the first section of the first transfer line and a length of the first section of the fourth transfer line are equal and both are a second length, and the first length is greater than the second length.

For example, in the display substrate provided by an embodiment of the present disclosure, pixel units in a same group are in a same row and arranged adjacent to each other in turn.

For example, in the display substrate provided by an embodiment of the present disclosure, the display substrate comprises a silicon-based organic light-emitting diode display substrate.

At least one embodiment of the present disclosure further provides a display device, which comprises the display substrate according to any one of the embodiments of the present disclosure.

At least one embodiment of the present disclosure further provides a method for driving the display substrate according to any one of the embodiments of the present disclosure. The at least two pixel units comprised in each group of pixel units comprise a first pixel unit to an N-th pixel unit, the at least two light-emitting control signals comprise a first light-emitting control signal to an N-th light-emitting control signal, one frame of display phase comprises a first phase to an N-th phase, and N is a positive integer. The method comprises: in a P-th phase of the display phase, providing first scanning signals shifted in turn to a plurality of rows of pixel units of the display substrate, and setting a P-th light-emitting control signal of each row of pixel units to be at an operating level, and setting other light-emitting control signals, except the P-th light-emitting control signal, in the at least two light-emitting control signals of each row of pixel units to be at a non-operating level, so as to realize progressive scanning for P-th pixel units in respective groups of pixel units in the P-th phase, where $1 \leq P \leq N$ and P is an integer.

For example, in the method provided by an embodiment of the present disclosure, in each phase from the first phase to the N-th phase, the first scanning signals corresponding to pixel units in a same row have pulse waveforms with the operating level, and in the display phase, an amount of the pulse waveforms of the first scanning signals corresponding to pixel units in the same row is N.

For example, the method provided by an embodiment of the present disclosure further comprises: in a blanking phase, setting the at least two light-emitting control signals of each row of pixel units to be at the non-operating level, and setting a first scanning signal and a second scanning signal of a target row of pixel units to be at the operating level. The target row of pixel units are pixel units to be detected.

BRIEF DESCRIPTION OF THE DRAWINGS

In order to clearly illustrate the technical solutions of the embodiments of the present disclosure, the drawings of the embodiments will be briefly described in the following: it is obvious that the described drawings are only related to some embodiments of the present disclosure and thus are not limitative to the present disclosure.

DETAILED DESCRIPTION

In order to make objects, technical solutions and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments of the present disclosure, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly. In order to keep the following description of the embodiments of the present disclosure clear and concise, detailed descriptions of some known functions and components are omitted in the present disclosure.

The silicon-based OLED integrates characteristics of the OLED and has advantages of a complementary metal oxide semiconductor (CMOS) technology, which can achieve high PPI (a current technology of silicon-based OLED can achieve about 4000 PPI) and can be mass-produced, thus contributing to reducing the size and production cost. With the improvement of consumer's demand for display performance, the silicon-based OLED technology is facing many challenges.

Firstly, the silicon-based OLED technology is restricted by the process of pixel circuit itself. A pixel size corresponding to 4000 PPI is about 4 μm. If the PPI needs to be further increased to achieve higher resolution, the pixel size needs to be further reduced, which challenges an analog CMOS process. For example, a capacitance area of a storage capacitor cannot be significantly improved, and it is difficult to keep a voltage stable with a capacitor having a small area. The present CMOS technology can achieve capacitance per unit area less than 2 Ff/$\mu m^2$, which leads to difficulty of achieving the higher PPI.

Figure 1:
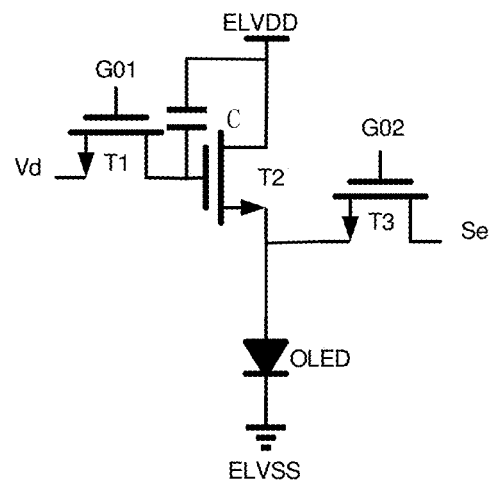
FIG. 1 is a schematic diagram of a pixel circuit.

FIG. 1 is a schematic diagram of a pixel circuit. The pixel circuit is, for example, a pixel circuit suitable for the silicon-based OLED, and adopts a 3T1C structure. For example, T1 is a switching transistor, and under the control of a first gate signal G01, a data signal Vd is transmitted to a gate electrode of T2. T2 is a driving transistor, a drain electrode of the driving transistor T2 is connected to a high voltage terminal ELVDD, a source electrode of the driving transistor T2 is connected to an anode of OLED, and the driving transistor T2 provides a required driving current for OLED. T3 is a sensing transistor, under the control of a second gate signal G02, a sensed voltage value is transmitted to a sensing signal line Se for further transmitting the sensed voltage value to a compensation circuit. During a data writing period, the driving transistor T2 works in a sub-threshold region, so as to enable the driving transistor T2 to have a linear following relationship at a G point and an S point, and change a current of the driving transistor T2 by writing the data signal, thus adjusting the brightness of the OLED.

If the PPI needs to be increased, a size of the MOS transistor needs to be reduced, and a size of the storage capacitor C also needs to be reduced. Under the present CMOS process conditions, in the case where the capacitance per unit area cannot be improved, reducing the capacitance area may cause the data signal (voltage value) transmitted to the gate electrode of the driving transistor T2 to be unable to be maintained within one frame, which may lead to display problems and reduce the display quality.

Secondly, the silicon-based OLED technology is restricted by the driving circuit corresponding to the pixel circuit. Under the same size area, the higher PPI, the more data driver and gate driver are needed, which may greatly increase a chip area and power consumption, and increase a chip cost. Faced with a huge number of channels, how to reduce the area of the driving circuit and control the power consumption is a problem that restricts the development of the silicon-based OLED technology.

Thirdly, the silicon-based OLED technology is restricted by the compensation circuit. Similar to OLED, the silicon-based OLED also faces a problem of a threshold voltage drift, which requires to compensate the threshold voltage. The present silicon-based products do not compensate for the threshold voltage. Generally, the capacitance of a large-size OLED sensing lines can be as high as several hundred pf, while the corresponding capacitance in the silicon-based OLED is only in an order of pf, which is equivalent to a volume of a sampling capacitance. According to a traditional design timing, a compensation deviation may be caused by capacitance sharing and capacitance deviation between sensing signal lines, thus reducing the compensation effect or even failing to obtain the compensation effect.

Fourthly, the silicon-based OLED technology is restricted by a system level. The higher the PPI, the more data needs to be processed, the larger the bandwidth and the more complicated algorithm, which may greatly increase the area and power consumption of the system. How to achieve higher definition display and save power consumption and area under the existing bandwidth is a problem that restricts the development of the silicon-based OLED technology.

At least one embodiment of the present disclosure provides a display substrate, a method for driving a display substrate, and a display device. The pixel circuit in the display substrate realizes capacitance multiplexing, so that one storage capacitor corresponds to a plurality of pixel units, and only one capacitor needs to be set in an area occupied by a plurality of pixel units on the base substrate, so that the area of the capacitor can be increased, which is beneficial to the voltage maintenance of the capacitor, and thus the display quality can be improved.

Next, embodiments of the present disclosure will be described in detail with reference to the accompanying drawings. It should be noted that the same reference numerals in different drawings will be used to refer to the same elements already described.

At least one embodiment of that present disclosure provides a display substrate. The display substrate includes a base substrate, a plurality of pixel units arranged on the base substrate, and a plurality of pixel circuits arranged on the base substrate. The plurality of pixel units are arranged in a plurality of rows and columns, and the plurality of pixel units are divided into a plurality of groups, each group of pixel units comprises at least two pixel units, and each pixel unit comprises a light-emitting element. Each pixel circuit is configured to drive a corresponding group of pixel units, and each pixel circuit comprises a driving circuit, a data writing circuit, a storage circuit, a sensing circuit, and a light-emitting control circuit. The driving circuit is connected to the data writing circuit, the storage circuit, the sensing circuit and the light-emitting control circuit, respectively, and is configured to control a value of the driving current. The data writing circuit is configured to write a data signal into the driving circuit in response to a first scanning signal: the storage circuit is configured to store the data signal written by the data writing circuit: and the sensing circuit is configured to connect the driving circuit to a sensing signal line in response to a second scanning signal. The light-emitting control circuit is connected to the driving circuit and respectively connected to at least two light-emitting elements of at least two pixel units of a corresponding group of pixel units, and the light-emitting control circuit is configured to apply the driving current to light-emitting elements of respective pixel units of the corresponding group of pixel units at different times in response to at least two light-emitting control signals. The light-emitting element is configured to emit light according to the driving current which is received.

Figure 2:
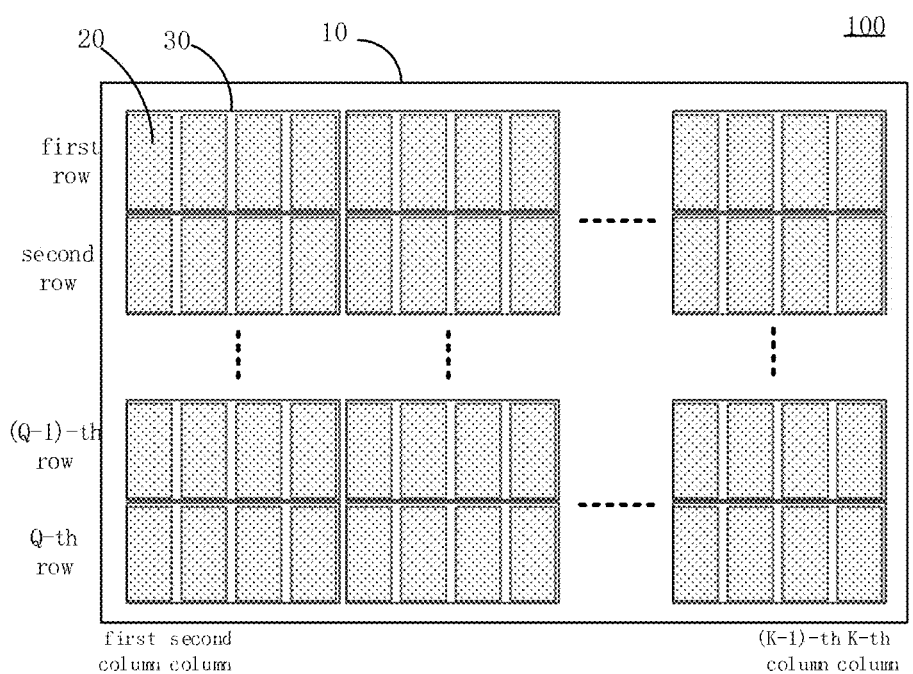
FIG. 2 is a layout schematic diagram of a display substrate provided by some embodiments of the present disclosure.

FIG. 2 is a layout schematic diagram of a display substrate provided by some embodiments of the present disclosure. As shown in FIG. 2, the display substrate 100 includes a base substrate 10, a plurality of pixel units 20 arranged on the base substrate 10, and a plurality of pixel circuits 30 arranged on the base substrate 10. For example, the base substrate 10 may be a silicon base substrate.

For example, the plurality of pixel units 20 are arranged in a plurality of rows and columns to form a pixel array. For example, the plurality of pixel units 20 can be arranged in Q rows and K columns, and Q and K can be arbitrary positive integers. For example, the plurality of pixel units 20 are divided into a plurality of groups, each group of pixel units 20 includes at least two pixel units 20, and the pixel units 20 in a same group are located in the same row and arranged adjacent to each other in turn. For example, in the example shown in FIG. 2, each group of pixel units 20 includes four pixel units 20, and the four pixel units 20 of each group are located in the same row and arranged adjacent to each other in turn. Of course, the embodiments of the present disclosure are not limited to this case, and the number of pixel units 20 contained in each group can be any number of 2, 3, 5, etc., which can be determined according to actual requirements, and the embodiments of the present disclosure are not limited to this case. Each pixel unit 20 includes a light-emitting element, which may be an OLED. Therefore, the display substrate 100 can be a silicon-based OLED display substrate.

For example, the plurality of pixel circuits 30 are in one-to-one correspondence with the plurality of groups of pixel units 20, and each pixel circuit 30 is used to drive a corresponding group of pixel units 20. That is, one pixel circuit 30 is used to drive a plurality of pixel units 20 belonging to the same group. The pixel circuits 30 may be stacked below a corresponding group of pixel units 20. Because the same group of pixel units 20 are located in the same row, in the case where the pixel circuit 30 is used to drive the corresponding group of pixel units 20, the driving control mode can be simplified, so that the effect of frame switching is more natural and uniform, and the display quality can be improved.

Figure 3A:
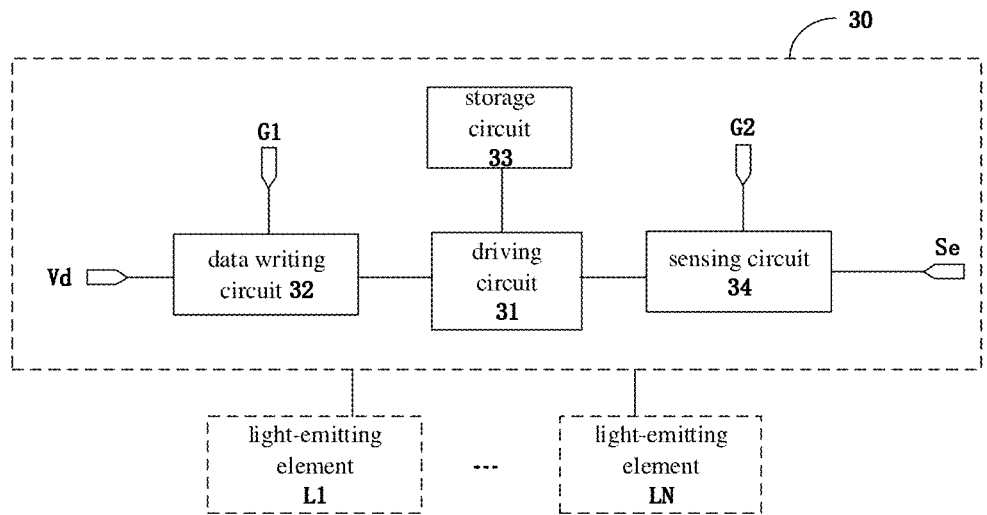
FIG. 3A is a schematic block diagram of a pixel circuit of a display substrate provided by some embodiments of the present disclosure.

FIG. 3A is a schematic block diagram of a pixel circuit of a display substrate provided by some embodiments of the present disclosure. As shown in FIG. 3A, each pixel circuit 30 includes a driving circuit 31, a data writing circuit 32, a storage circuit 33, and a sensing circuit 34.

The driving circuit 31 is connected to the data writing circuit 32, the storage circuit 33 and the sensing circuit 34, respectively, and is configured to control a value of the driving current. The writing circuit 32 is configured to write a data signal of a data line Vd into the driving circuit 31 in response to a first scanning signal of a first scanning line G1. The storage circuit 33 is configured to store the data signal written by the data writing circuit 32. The sensing circuit 34 is configured to connect the driving circuit 31 to the sensing signal line Se in response to a second scanning signal of a second scanning line G2. The light-emitting elements L1, . . . , LN are connected to the pixel circuit 30 and configured to emit light according to the received driving current. For example, the light-emitting elements L1, . . . , LN are light-emitting elements of the same group of pixel units 20.

Figure 3B:
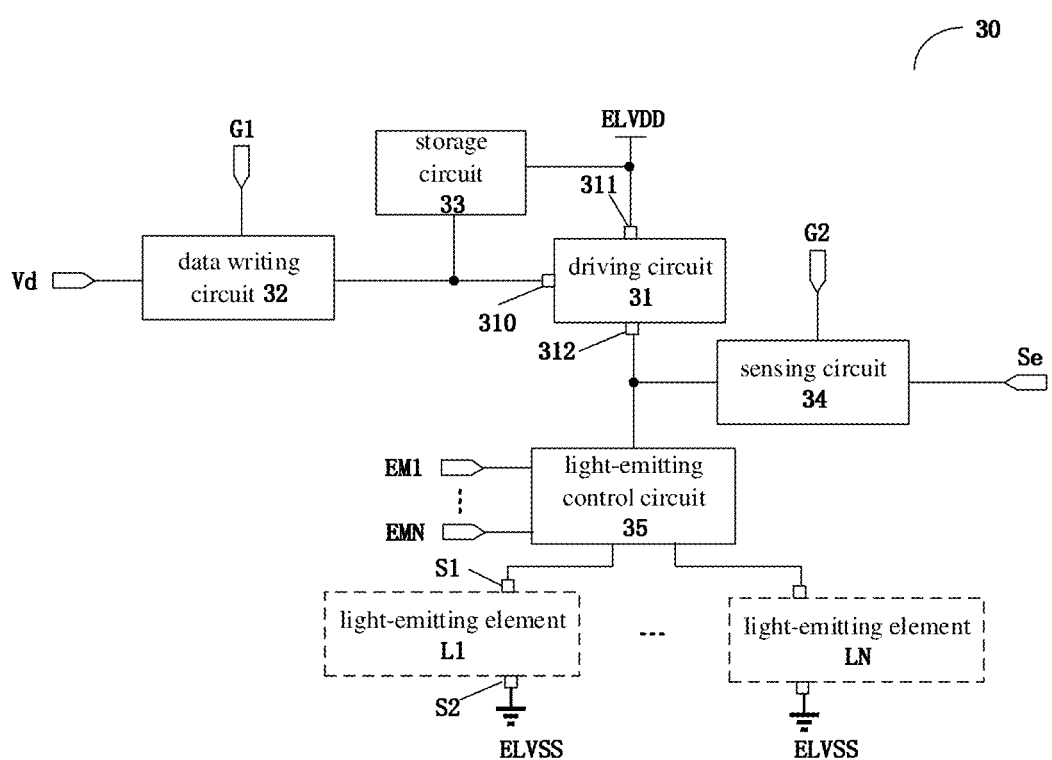
FIG. 3B is a schematic block diagram of a pixel circuit of another display substrate provided by some embodiments of the present disclosure.

FIG. 3B is a schematic block diagram of a pixel circuit of another display substrate provided by some embodiments of the present disclosure. As shown in FIG. 3B, each pixel circuit 30 includes a driving circuit 31, a data writing circuit 32, a storage circuit 33, a sensing circuit 34, and a light-emitting control circuit 35.

The driving circuit 31 includes a control terminal 310, a first terminal 311 and a second terminal 312, and the driving circuit 31 is configured to control the value of the driving current. The first terminal 311 of the driving circuit 31 receives a first voltage of a first voltage terminal ELVDD. For example, in some examples, the first terminal 311 of the driving circuit 31 may be directly connected to the first voltage terminal ELVDD. For example, in other examples, the first terminal 311 of the driving circuit 31 may also be connected to the first voltage terminal ELVDD via other elements.

The data writing circuit 32 is connected to the control terminal 310 of the driving circuit 31, and is configured to write the data signal to the control terminal 310 of the driving circuit 31 in response to the first scanning signal. For example, the data writing circuit 32 is connected to the data line Vd to receive the data signal, and the data signal may be a voltage signal. The data writing circuit 32 is also connected to the first scanning line G1 to receive the first scanning signal.

A first terminal of the storage circuit 33 is connected to the control terminal 310 of the driving circuit 31, and a second terminal of the storage circuit 33 is connected to the first terminal 311 of the driving circuit 31. The storage circuit 33 is configured to store the data signal written by the data writing circuit 32.

The sensing circuit 34 is connected to the second terminal 312 of the driving circuit 31, and is configured to connect the second terminal 312 of the driving circuit 31 to the sensing signal line Se in response to the second scanning signal. For example, the sensing circuit 34 is connected to the second scanning line G2 to receive the second scanning signal.

The light-emitting control circuit 35 is connected to the second terminal 312 of the driving circuit 31, and is connected to at least two light-emitting elements L1, . . . , LN of at least two pixel units 20 of a corresponding group of pixel units 20, respectively. For example, the light-emitting control circuit 35 is connected to the light-emitting elements L1, . . . , LN of all pixel units 20 in a corresponding group of pixel units 20, respectively. The light-emitting control circuit 35 is configured to respectively apply the driving current to the light-emitting elements L1, . . . , LN of respective pixel units 20 in the corresponding group of pixel units 20 at different times in response to at least two light-emitting control signals. For example, the light-emitting control circuit 35 is connected to at least two light-emitting control signal lines EM1, . . . , EMN to receive the at least two light-emitting control signals. For example, each light-emitting control signal line provides one light-emitting control signal. For example, in some examples, at a first time, the light-emitting control circuit 35 applies the driving current to the light-emitting element L1, meanwhile other light-emitting elements cannot receive the driving current: at a second time, the light-emitting control circuit 35 applies the driving current to the light-emitting element L2, meanwhile other light-emitting elements cannot receive the driving current, and so on.

Taking the light-emitting element L1 as an example, a first terminal S1 of the light-emitting element L1 is connected to the light-emitting control circuit 35, and a second terminal S2 of the light-emitting element L1 receives a second voltage of a second voltage terminal ELVSS. The light-emitting element L1 is configured to emit light according to the received driving current. The connection mode of other light-emitting elements is similar to the connection mode of the light-emitting element L1, which may be not repeated herein again.

In this embodiment, the first voltage terminal ELVDD, for example, is configured to maintain inputting a DC high level signal, which is called the first voltage. For example, the second voltage terminal ELVSS is configured to maintain inputting a DC low level signal, which is called the second voltage. For example, the second voltage may be a ground voltage. The following examples are the same and may not be described again.

Figure 4:
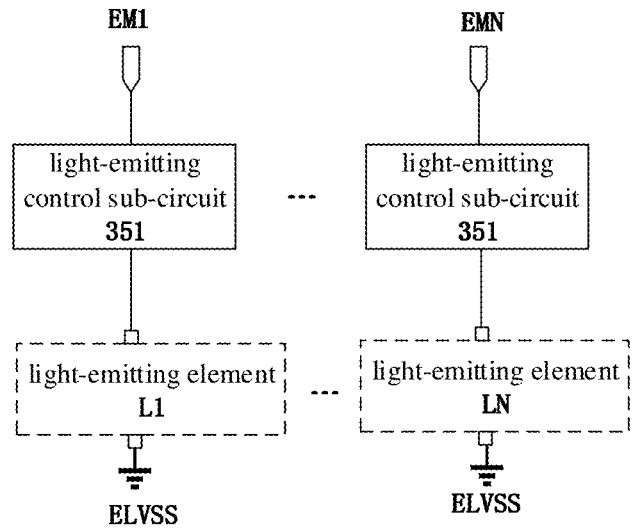
FIG. 4 is a schematic block diagram of a light-emitting control circuit in a pixel circuit of a display substrate provided by some embodiments of the present disclosure.

FIG. 4 is a schematic block diagram of a light-emitting control circuit in a pixel circuit of a display substrate provided by some embodiments of the present disclosure. As shown in FIG. 4, in the case where an amount of pixel units 20 included in each group of pixel units 20 is N (N is a positive integer), a corresponding light-emitting control circuit 35 includes N light-emitting control sub-circuits 351. Accordingly, the light-emitting control signals include N light-emitting control signals, that is, N light-emitting control sub-circuits 351 are correspondingly connected to N light-emitting control signal lines EM1, . . . , EMN, respectively, so as to receive N light-emitting control signals. The light-emitting elements of this group of pixel units 20 are L1, . . . , LN.

For example, each light-emitting control sub-circuit 351 is connected to a light-emitting element of one pixel unit 20 in a corresponding group of pixel units 20, and each light-emitting control sub-circuit 351 receives one of the N light-emitting control signals. Different light-emitting control sub-circuits 351 are connected to light-emitting elements of different pixel units 20 in the corresponding group of pixel units 20, and different light-emitting control sub-circuits 351 receive different light-emitting control signals. That is, N light-emitting control signals, N light-emitting control sub-circuits 351, and N light-emitting elements are in one-to-one correspondence, and each light-emitting control sub-circuit 351 receives one corresponding light-emitting control signal and controls one corresponding light-emitting element to emit light.

For example, in the case where a certain light-emitting control signal is at an active level, the corresponding light-emitting control sub-circuit 351 is turned on, thereby applying the driving current to the corresponding light-emitting element so as to drive the corresponding light-emitting element to emit light. At this time, the rest of the light-emitting control signals are at an invalid level, so that the rest of the light-emitting control sub-circuits 351 are turned off, so that the rest of the light-emitting elements do not emit light. Therefore, independent control of the light-emitting elements can be realized.

Figure 5A:
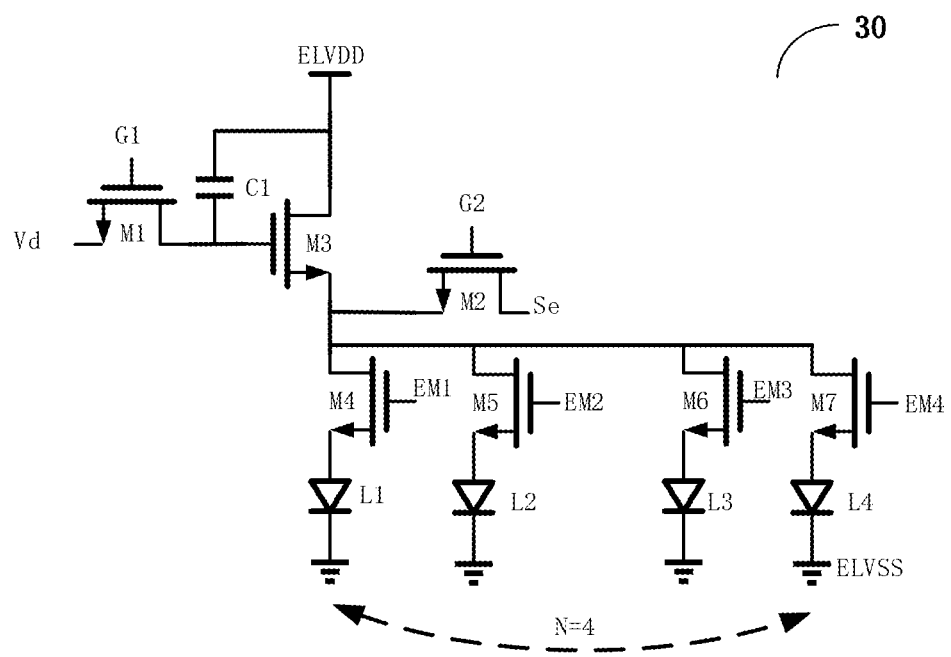
FIG. 5A is a schematic diagram of a specific example of the pixel circuit as shown in FIG. 3B.

FIG. 5A is a schematic diagram of a specific example of the pixel circuit shown in FIG. 3B. As shown in FIG. 5A, the data writing circuit 32 may include a first transistor M1, the sensing circuit 34 may include a second transistor M2, and the driving circuit 31 may include a third transistor M3. The storage circuit 33 may include a storage capacitor C1, and the storage capacitor C1 includes two capacitor plates which are stacked. One of the two capacitor plates serves as a first electrode of the storage capacitor C1, and the other of the two capacitor plates serves as a second electrode of the storage capacitor C1. The structure of the capacitor plates is described later and is not described in detail here.

For example, a gate electrode of the third transistor M3 serves as the control terminal 310 of the driving circuit 31, a first electrode of the third transistor M3 serves as the first terminal 311 of the driving circuit 31, and a second electrode of the third transistor M3 serves as the second terminal 312 of the driving circuit 31. The first electrode of the third transistor M3 is connected to the first voltage terminal ELVDD.

A gate electrode of the first transistor M1 is connected to the first scanning line G1 to receive the first scanning signal, a first electrode of the first transistor M1 is connected to the data line Vd to receive the data signal, and a second electrode of the first transistor M1 is connected to the gate electrode of the third transistor M3.

A gate electrode of the second transistor M2 is connected to the second scanning line G2 to receive the second scanning signal, a first electrode of the second transistor M2 is connected to the second electrode of the third transistor M3, and a second electrode of the second transistor M2 is connected to the sensing signal line Se.

The first electrode of the storage capacitor C1 (that is, one of the two capacitor plates) serves as the first terminal of the storage circuit 33, and a second electrode of the storage capacitor C1 (that is, the other of the two capacitor plates) serves as the second terminal of the storage circuit 33. That is, the first electrode of the storage capacitor C1 is connected to the gate electrode of the third transistor M3 as the first terminal of the storage circuit 33, and the second electrode of the storage capacitor C1 is connected to the first electrode of the third transistor M3 as the second terminal of the storage circuit 33.

For example, each light-emitting control sub-circuit 351 includes a light-emitting control transistor. For example, taking it as an example that the light-emitting control circuit 35 includes four light-emitting control sub-circuits 351 (that is, N=4), the four light-emitting control sub-circuits 351 can be implemented as four light-emitting control transistors M4-M7. Each light-emitting control sub-circuit 351 is implemented as one light-emitting control transistor. It should be noted that N can be any suitable positive integer, as long as it is greater than or equal to 2. Although four light-emitting control transistors M4-M7 are shown in FIG. 5A, this does not constitute a limitation to the embodiments of the present disclosure. For example, gate electrodes of the light-emitting control transistors M4-M7 are connected to the corresponding light-emitting control signal lines EM1-EM4 to receive the corresponding light-emitting control signals, first electrodes of the light-emitting control transistors M4-M7 are connected to the second electrode of the third transistor M3, and second electrodes of the light-emitting control transistors M4-M7 are connected to the corresponding light-emitting elements L1-L4.

For example, in this example, N light-emitting control sub-circuits 351 include a first light-emitting control sub-circuit, a second light-emitting control sub-circuit, a third light-emitting control sub-circuit, and a fourth light-emitting control sub-circuit. The first light-emitting control sub-circuit includes a first light-emitting control transistor M4, the second light-emitting control sub-circuit includes a second light-emitting control transistor M5, the third light-emitting control sub-circuit includes a third light-emitting control transistor M6, and the fourth light-emitting control sub-circuit includes a fourth light-emitting control transistor M7.

For example, a gate electrode of the first light-emitting control transistor M4 is connected to the light-emitting control signal line EM1 so as to receive the corresponding light-emitting control signal, a first electrode of the first light-emitting control transistor M4 is connected to the second electrode of the third transistor M3, and a second electrode of the first light-emitting control transistor M4 is connected to the light-emitting element L1. A gate electrode of the second light-emitting control transistor M5 is connected to the light-emitting control signal line EM2 so as to receive the corresponding light-emitting control signal, a first electrode of the second light-emitting control transistor M5 is connected to the second electrode of the third transistor M3, and a second electrode of the second light-emitting control transistor M5 is connected to the light-emitting element L2. A gate electrode of the third light-emitting control transistor M6 is connected to the light-emitting control signal line EM3 so as to receive the corresponding light-emitting control signal, a first electrode of the third light-emitting control transistor M6 is connected to the second electrode of the third transistor M3, and a second electrode of the third light-emitting control transistor M6 is connected to the light-emitting element L3. A gate electrode of the fourth light-emitting control transistor M7 is connected to the light-emitting control signal line EM4 so as to receive the corresponding light-emitting control signal, a first electrode of the fourth light-emitting control transistor M7 is connected to the second electrode of the third transistor M3, and a second electrode of the fourth light-emitting control transistor M7 is connected to the light-emitting element L4.

For example, the light-emitting elements L1-L4 are also connected to the second voltage terminal ELVSS, respectively. For example, the light-emitting elements L1-L4 belong to four different pixel units 20, and the four different pixel units 20 belong to the same group of pixel units. That is, the pixel circuit 30 is used to drive four light-emitting elements L1-L4 in one group of pixel units 20.

Thus, the pixel circuit 30 realizes capacitance multiplexing, so that one storage capacitor C1 corresponds to a plurality of pixel units 20. In a common pixel circuit, one data writing transistor, one driving transistor and one storage capacitor correspond to one light-emitting element, while in the embodiments of the present disclosure, the transistors M1, M2, M3 and the storage capacitor C1 correspond to N (for example, N≤2) light-emitting elements, and the N light-emitting elements are controlled by respective corresponding light-emitting control transistors. Therefore, in the area occupied by N pixel units 20 on the base substrate 10, only one capacitor needs to be provided, so that the area of the capacitor can be increased, which is beneficial to the voltage maintenance of the capacitor.

Figure 5B:
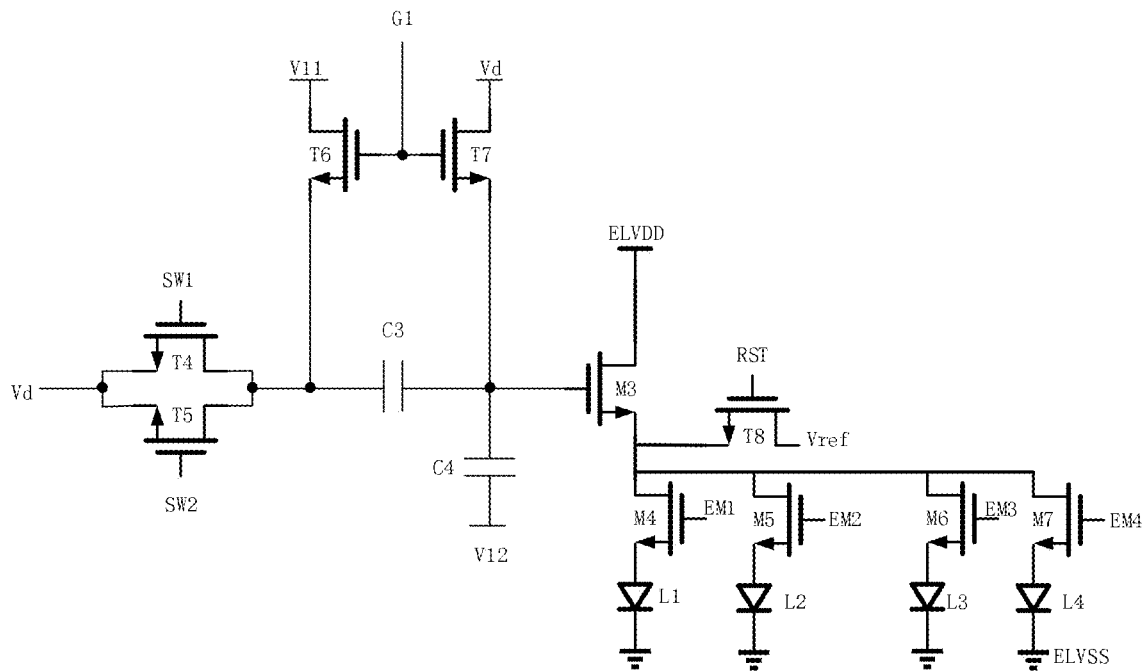
FIG. 5B is a schematic diagram of a specific example of the pixel circuit as shown in FIG. 3A.

It should be noted that, in the embodiments of the present disclosure, the pixel circuit 30 can also adopt any other suitable circuit structure, for example, it can include more components and structures, for example, it can also include a circuit for realizing internal compensation, etc., which can be determined according to actual requirements, and the embodiments of the present disclosure do not limit this case. For example, in other examples, the pixel circuit 30 can also be implemented as the circuit structure as shown in FIG. 5B. For example, as shown in FIG. 5B, the data writing circuit can be implemented as transistors T4-T7, and the storage circuit can be implemented as capacitors C3 and C4. The pixel circuit also includes a reset circuit, which is implemented as a transistor T8. It should be noted that the sensing circuit is not shown in FIG. 5B, and the arrangement of the sensing circuit can be referred to the circuit structure shown in FIG. 5A. For example, any one of the transistors T4-T7 can be equivalent to the first transistor M1 described above, and any one of the capacitors C3 and C4 can be equivalent to the storage capacitor C1 described above. The pixel circuit can drive four light-emitting elements L1-L4 in one group of pixel units 20.

Figure 6:
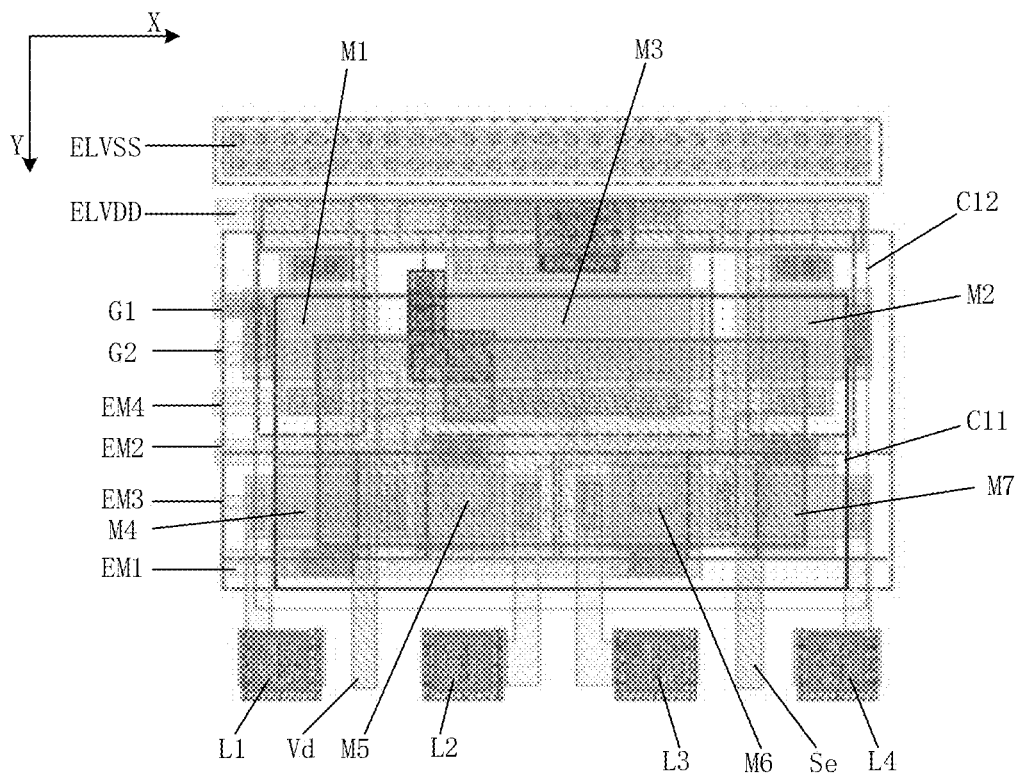
FIG. 6 is a plane view of a layer structure of a display substrate provided by some embodiments of the present disclosure.

FIG. 6 is a plane view of a layer structure of a display substrate provided by some embodiments of the present disclosure. As shown in FIG. 6, the storage capacitor C1 includes two capacitor plates which are stacked, such as a first capacitor plate C11 and a second capacitor plate C12. An orthographic projection of at least one of the two capacitor plates on the base substrate 10 at least partially covers an orthographic projection of the first transistor M1 on the base substrate 10 and at least partially covers an orthographic projection of the second transistor M2 on the base substrate 10. For example, only the orthographic projection of the first capacitor plate C11 at least partially covers the orthographic projection of the first transistor M1 on the base substrate 10 and at least partially covers the orthographic projection of the second transistor M2 on the base substrate 10, or only the orthographic projection of the second capacitor plate C12 at least partially covers the orthographic projection of the first transistor M1 on the base substrate 10 and at least partially covers the orthographic projection of the second transistor M2 on the base substrate 10. It is also possible that both the orthographic projection of the first capacitor plate C11 and the orthographic projection of the second capacitor plate C12 at least partially cover the orthographic projection of the first transistor M1 on the base substrate 10 and at least partially cover the orthographic projection of the second transistor M2 on the base substrate 10. Here, "orthographic projection" refers to a projection in a direction perpendicular to the base substrate 10. For example, "at least partial cover" can refer to partial coverage or full coverage, and it can be considered as at least partial coverage as long as there is overlap.

For example, the orthographic projection of the first transistor M1 on the base substrate 10 at least includes an orthographic projection of an active layer of the first transistor M1 on the base substrate 10. That is, the orthographic projection of the first transistor M1 can be the orthographic projection of the active layer of the first transistor M1, and the orthographic projection of the first transistor M1 can further include orthographic projections of the gate electrode, the source electrode and the drain electrode of the first transistor M1 on the basis of including the orthographic projection of the active layer of the first transistor M1. Similarly, the orthographic projection of the second transistor M2 on the base substrate 10 at least includes an orthographic projection of an active layer of the second transistor M2 on the base substrate 10. That is, the orthographic projection of the second transistor M2 can be the orthographic projection of the active layer of the second transistor M2, and the orthographic projection of the second transistor M2 can further include orthographic projections of the gate electrode, the source electrode and the drain electrode of the second transistor M2 on the basis of including the orthographic projection of the active layer of the second transistor M2.

Because the signal (e.g., the data signal) transmitted by the first transistor M1 and the signal (e.g., the sensing signal) transmitted by the second transistor M2 are usually jumping signals, by enabling the orthographic projection of the capacitor plate of the storage capacitor C1 to at least partially cover the orthographic projections of the first transistor M1 and the second transistor M2, the influence of the pixel circuit 30 on the light-emitting element (e.g., the OLED) can be shielded or weakened by the capacitor plate, thereby improving the display quality.

For example, in some examples, the orthographic projection of at least one of the two capacitor plates of the storage capacitor C1 on the base substrate 10 at least partially covers an orthographic projection of the third transistor M3 on the base substrate 10. For example, the orthographic projection of the third transistor M3 on the base substrate 10 at least includes an orthographic projection of an active layer of the third transistor M3 on the base substrate 10. That is, the orthographic projection of the third transistor M3 can be the orthographic projection of the active layer of the third transistor M3, and the orthographic projection of the third transistor M3 can further include the orthographic projections of the gate electrode, the source electrode and the drain electrode of the third transistor M3 on the basis of including the orthographic projection of the active layer of the third transistor M3. Therefore, the influence of the pixel circuit 30 on the light-emitting elements can be further shielded or weakened by the capacitor plate, thereby improving the display quality.

For example, in some examples, the orthographic projection of at least one of the two capacitor plates of the storage capacitor C1 on the base substrate 10 at least partially covers an orthographic projection of the light-emitting control transistor on the base substrate 10. The light-emitting control transistor that is at least partially covered may be any one or more of the first light-emitting control transistor M4, the second light-emitting control transistor M5, the third light-emitting control transistor M6, and the fourth light-emitting control transistor M7. Therefore, the influence of the pixel circuit 30 on the light-emitting elements can be further shielded or weakened by the capacitor plate, thereby improving the display quality.

Figure 7A:
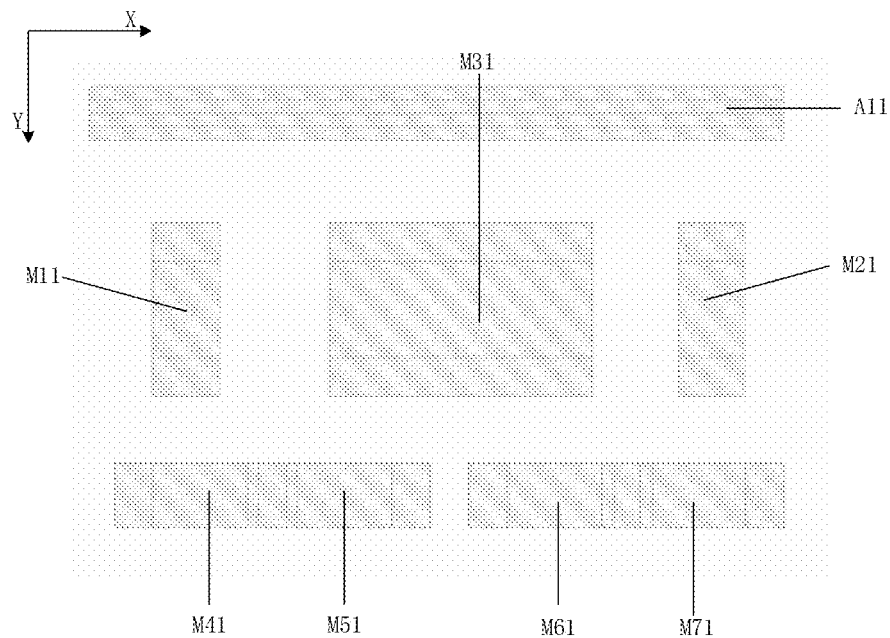
FIG. 7A is a plane view of an active layer of a display substrate provided by some embodiments of the present disclosure.
Figure 11A:
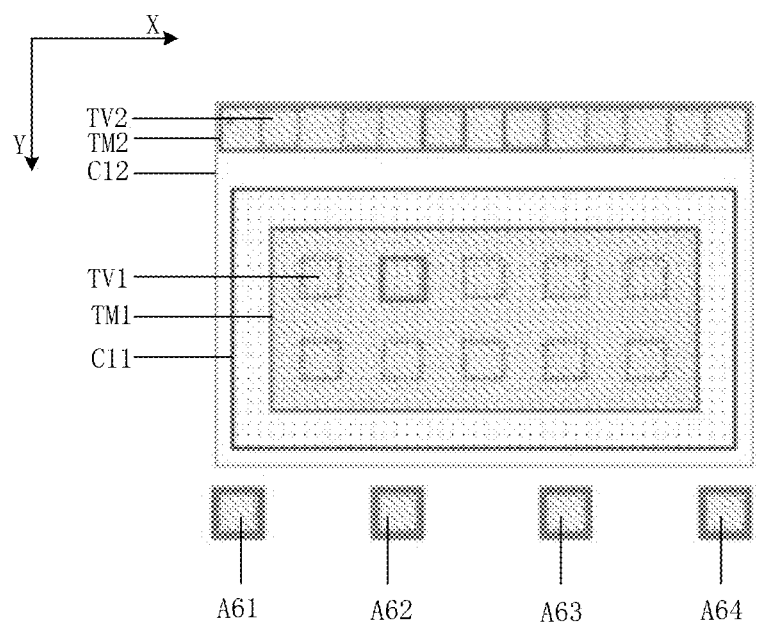
FIG. 11A is a plane view of a storage capacitor of a display substrate provided by some embodiments of the present disclosure.
Figure 11B:
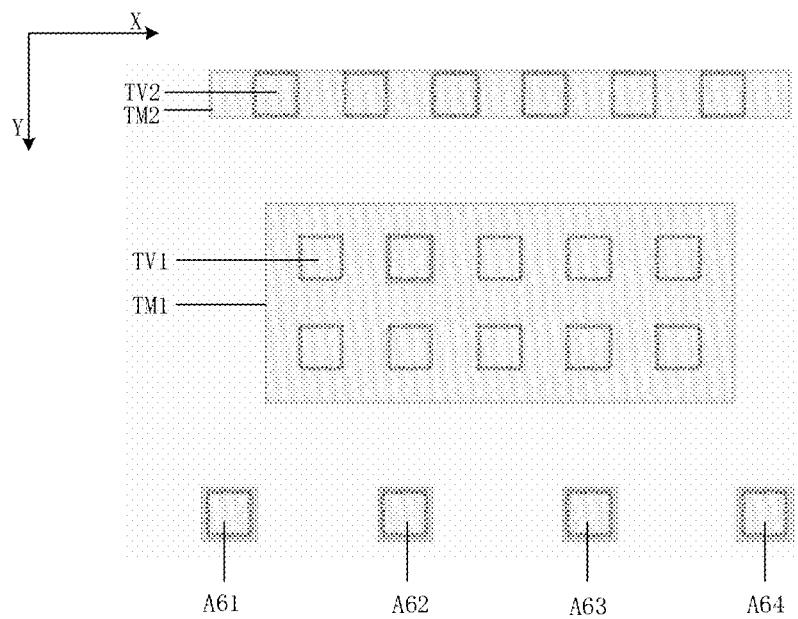
FIG. 11B is a plane view of a capacitor transfer electrode layer in a storage capacitor of a display substrate provided by some embodiments of the present disclosure.

FIG. 7A to FIG. 11B respectively show plane views of respective layers of wiring of the display substrate shown in FIG. 6. FIG. 7A is a plane view of an active layer of the display substrate provided by some embodiments of the disclosure, FIG. 7B is a plane view of a gate layer of the display substrate provided by some embodiments of the disclosure, FIG. 7C is a plane view of stacking the layer structures of FIG. 7A and FIG. 7B, FIG. 8A is a plane view of an injection layer of the display substrate provided by some embodiments of the disclosure, and FIG. 8B is a plane view of a first metal layer of the display substrate provided by some embodiments of the disclosure. FIG. 8C is a plane view of stacking layer structures of FIG. 7C, FIG. 8A and FIG. 8B, FIG. 9A is a plane view of a second metal layer of the display substrate provided by some embodiments of the present disclosure, FIG. 9B is a plane view of staking layer structures of FIG. 9A and FIG. 8C, FIG. 10A is a plane view of a third metal layer of the display substrate provided by some embodiments of the present disclosure, and FIG. 10B is a plane view of a fourth metal layer of the display substrate provided by some embodiments of the present disclosure. FIG. 10C is a plane view of a fifth metal layer of the display substrate provided by some embodiments of the present disclosure, FIG. 10D is a plane view of a sixth metal layer of the display substrate provided by some embodiments of the present disclosure, FIG. 10E is a plane view of stacking the layer structures of FIG. 9B and FIG. 10A to FIG. 10D, FIG. 11A is a plane view of a storage capacitor of the display substrate provided by some embodiments of the present disclosure, and FIG. 11B is a plane view of a capacitor transfer electrode layer in the storage capacitor of the display substrate provided by some embodiments of the present disclosure.

Next, the structure of each layer of the display substrate 100 is briefly described with reference to the plane views shown in FIG. 6 and FIG. 7A to FIG. 11B. It should be noted that only the components and structures related to the embodiments of the present disclosure are shown in the plane views as shown in FIG. 6 and FIG. 7A to FIG. 11B, and other components and structures not shown can refer to the conventional design and are not described in detail here. Furthermore, the components and structures shown in FIG. 6 and FIG. 7A to FIG. 11B are only schematic but not restrictive, and this case does not constitute a limitation on the embodiments of the present disclosure.

It should be noted that in the following description, G1, G2, Vd, Se, ELVDD, ELVSS, EM1, EM2, EM3, EM4, etc. are used to represent not only the corresponding signal terminals or signal lines, but also the corresponding signals or levels, which are the same in the following embodiments and may not be described again.

Figure 7B:
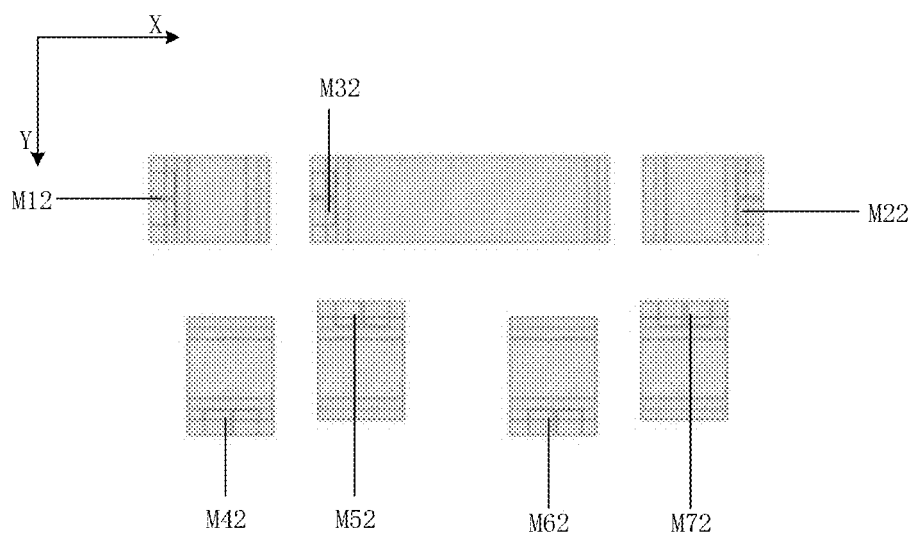
FIG. 7B is a plane view of a gate layer of a display substrate provided by some embodiments of the present disclosure.
Figure 7C:
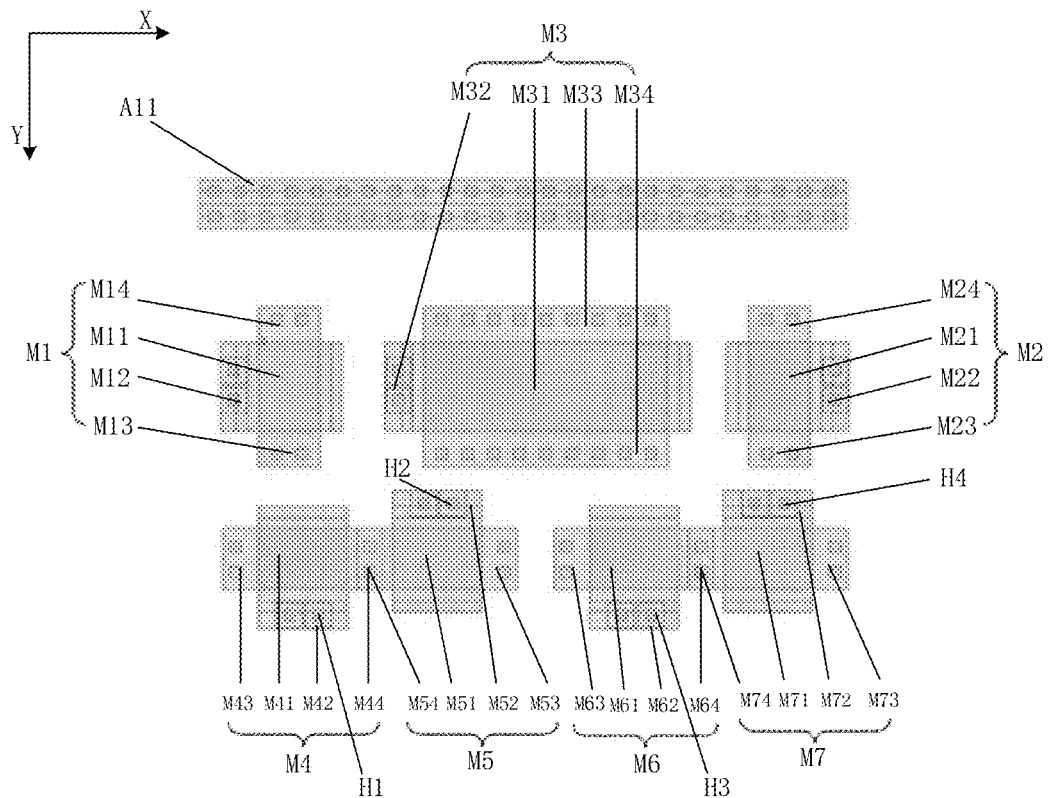
FIG. 7C is a plane view of stacking layer structures of FIG. 7A and FIG. 7B.

As shown in FIG. 7A to FIG. 7C, the first transistor M1 includes an active layer M11, a gate electrode M12, a first electrode M13 and a second electrode M14: the second transistor M2 includes an active layer M21, a gate electrode M22, a first electrode M23 and a second electrode M24: the third transistor M3 includes an active layer M31, a gate electrode M32, a first electrode M33 and a second electrode M34. The first light-emitting control transistor M4 includes an active layer M41, a gate electrode M42, a first electrode M43 and a second electrode M44: the second light-emitting control transistor M5 includes an active layer M51, a gate electrode M52, a first electrode M53 and a second electrode M54: the third light-emitting control transistor M6 includes an active layer M61, a gate electrode M62, a first electrode M63 and a second electrode M64; the fourth light-emitting control transistor M7 includes an active layer M71, a gate electrode M72, a first electrode M73 and a second electrode M74.

The orthographic projection of the first transistor M1 on the base substrate 10 and the orthographic projection of the second transistor M2 on the base substrate 10 are located on different sides of the orthographic projection of the third transistor M3 on the base substrate 10. As mentioned above, the orthographic projection of the first transistor M1 on the base substrate 10 at least includes the orthographic projection of the active layer M11 of the first transistor M1 on the base substrate 10. Similarly, the orthographic projection of the second transistor M2 on the base substrate 10 at least includes the orthographic projection of the active layer M21 of the second transistor M2 on the base substrate 10, and the orthographic projection of the third transistor M3 on the base substrate 10 at least includes the orthographic projection of the active layer M31 of the third transistor M3 on the base substrate 10.

The first light-emitting control transistor M4, the second light-emitting control transistor M5, the third light-emitting control transistor M6 and the fourth light-emitting control transistor M7 are distributed along a first direction, for example, the first direction is an X direction. A first via hole H1 connected to the gate electrode M42 of the first light-emitting control transistor M4, a second via hole H2 connected to the gate electrode M52 of the second light-emitting control transistor M5, a third via hole H3 connected to the gate electrode M62 of the third light-emitting control transistor M6, and a fourth via hole H4 connected to the gate electrode M72 of the fourth light-emitting control transistor M7 are not located on a same straight line extending along the first direction. For example, in the example shown in FIG. 7C, the first via hole H1, the second via hole H2, the third via hole H3 and the fourth via hole H4 are located on two straight lines extending along the first direction, the first via hole H1 and the third via hole H3 are located on one straight line, and the second via hole H2 and the fourth via hole H4 are located on the other straight line.

For example, the first electrode M43 and the second electrode M44 of the first light-emitting control transistor M4, the first electrode M53 and the second electrode M54 of the second light-emitting control transistor M5, the first electrode M63 and the second electrode M64 of the third light-emitting control transistor M6, and the first electrode M73 and the second electrode M74 of the fourth light-emitting control transistor M7 are all located on a same extension line extending along the first direction (e.g., the X direction). The first via hole H1, the second via hole H2, the third via hole H3, and the fourth via hole H4 are alternately located on both sides of the extension line. In this way, it is helpful to facilitating routing and reducing the length of gate lines connected to respective gate electrodes.

For example, the gate electrode M12 of the first transistor M1, the gate electrode M22 of the second transistor M2, and the gate electrode M32 of the third transistor M3 are located on a same distribution line extending along the first direction (e.g., the X direction), and the distribution line is parallel to the above-mentioned extension line with a gap. That is, the first transistor M1, the second transistor M2, and the third transistor M3 are approximately located in one row, while the first light-emitting control transistor M4, the second light-emitting control transistor M5, the third light-emitting control transistor M6, and the fourth light-emitting control transistor M7 are approximately located in another row. For example, a low voltage transfer electrode A11 extends along the first direction and is spaced apart from each transistor.

Figure 8A:
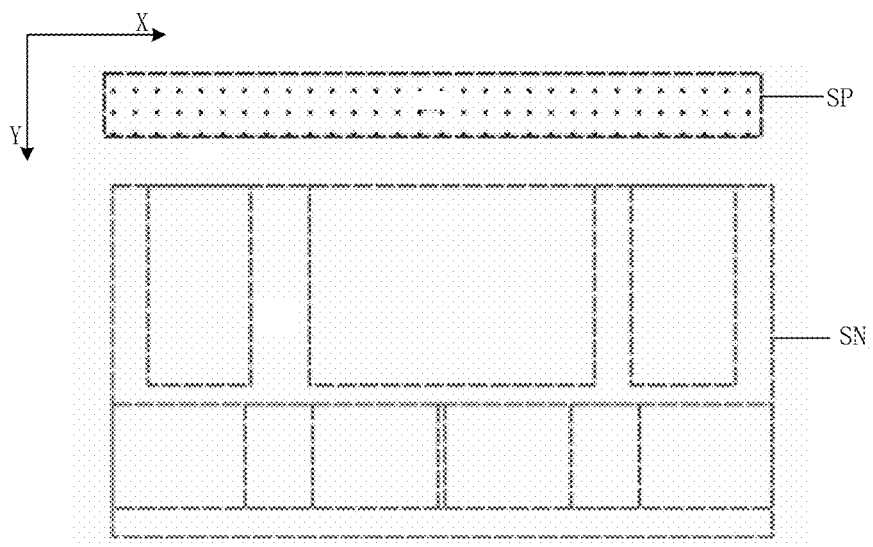
FIG. 8A is a plane view of an injection layer of a display substrate provided by some embodiments of the present disclosure.
Figure 8B:
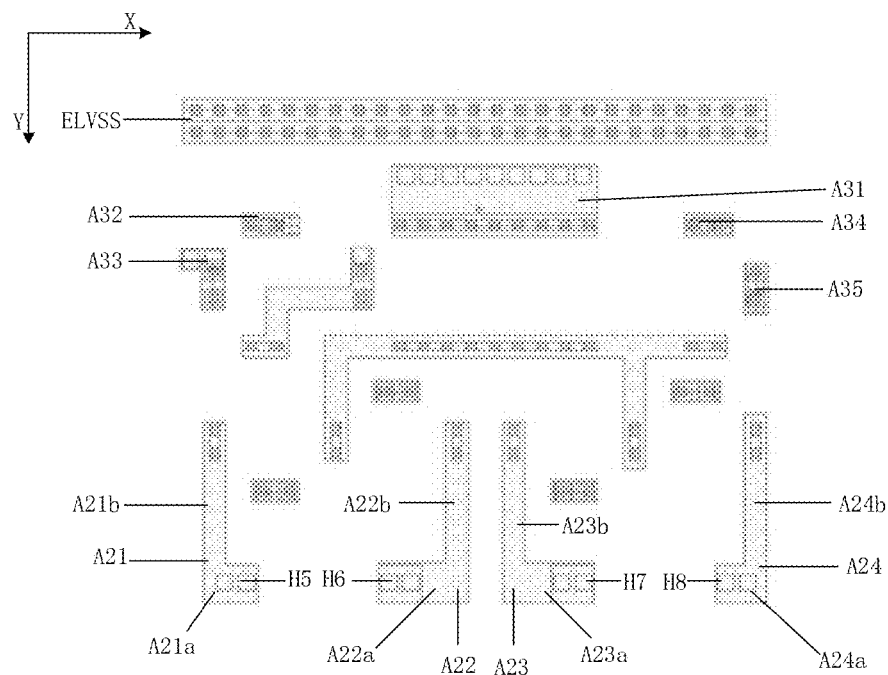
FIG. 8B is a plane view of a first metal layer of a display substrate provided by some embodiments of the present disclosure.
Figure 8C:
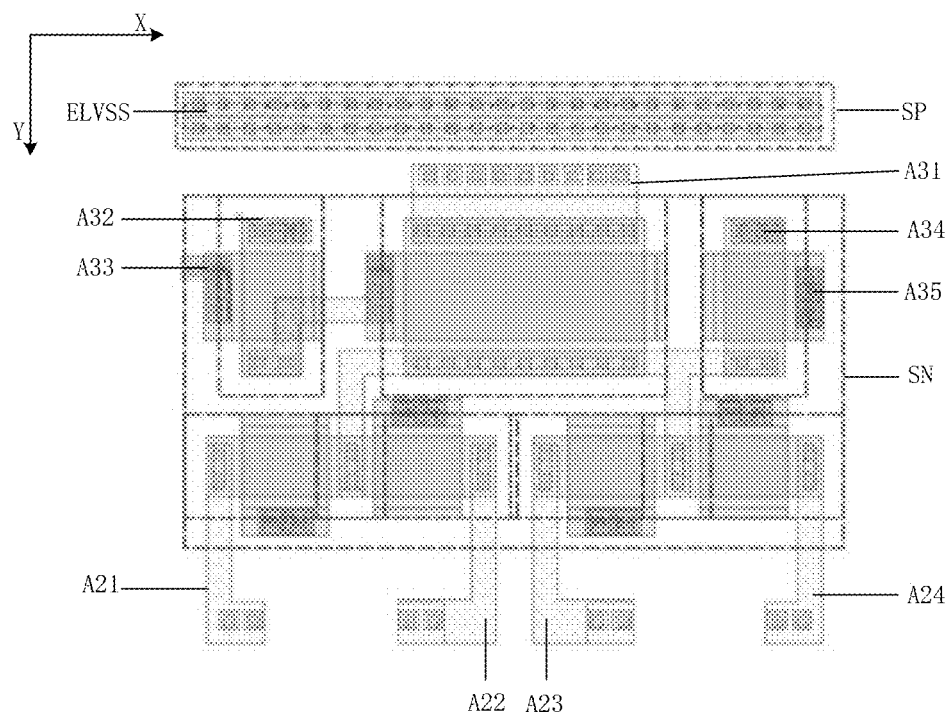
FIG. 8C is a plane view of stacking layer structures of FIG. 7C, FIG. 8A and FIG. 8B.

As shown in FIG. 8A to FIG. 8C, an orthographic projection of a P-type injection layer SP on the base substrate 10 covers an orthographic projection of the low voltage transfer electrode A11 on the base substrate 10. An orthographic projection of an N-type injection layer SN on the base substrate 10 covers the orthographic projections of respective transistors on the base substrate 10. A transfer electrode A31 is used to be connected to the first voltage line ELVDD formed later and the capacitor plate. A transfer electrode A32 is used to be connected to the data line Vd formed later. A transfer electrode 33 is used to be connected to the first scanning line G1 formed later. A transfer electrode 34 is used to be connected to the sensing signal line Se formed later. A transfer electrode 35 is used to be connected to the second scanning line G2 formed later. The second voltage line ELVSS covers the low voltage transfer electrode A11 and the second voltage line ELVSS is connected to the low voltage transfer electrode A11 through a via hole to transmit a low voltage signal.

A first transfer line A21, a second transfer line A22, a third transfer line A23 and a fourth transfer line A24 are respectively used to connect respective light-emitting control transistors to the corresponding light-emitting element. For example, the first light-emitting control transistor M4 is connected to the corresponding light-emitting element through the first transfer line A21, the second light-emitting control transistor M5 is connected to the corresponding light-emitting element through the second transfer line A22, the third light-emitting control transistor M6 is connected to the corresponding light-emitting element through the third transfer line A23, and the fourth light-emitting control transistor M7 is connected to the corresponding light-emitting element through the fourth transfer line A24.

For example, a length of a current flow path between the second light-emitting control transistor M5 and a corresponding light-emitting element and a length of a current flow path between the third light-emitting control transistor M6 and a corresponding light-emitting element are greater than a length of a current flow path between the first light-emitting control transistor M4 and a corresponding light-emitting element and a length of a current flow path between the fourth light-emitting control transistor M7 and a corresponding light-emitting element. That is, the length of the second transfer line A22 and the length of third transfer line A23 are greater than the length of the first transfer line A21 and the length of fourth transfer line A24. For example, the length of any one of the second transfer line A22 and the third transfer line A23 is greater than the length of any one of the first transfer line A21 and the fourth transfer line A24. Here, the length of the first transfer line A21 is equal to the length of the current flow path between the first light-emitting control transistor M4 and the corresponding light-emitting element, the length of the second transfer line A22 is equal to the length of the current flow path between the second light-emitting control transistor M5 and the corresponding light-emitting element, the length of the third transfer line A23 is equal to the length of the current flow path between the third light-emitting control transistor M6 and the corresponding light-emitting element, and the length of the fourth transfer line A24 is equal to the length of the current flow path between the fourth light-emitting control transistor M7 and the corresponding light-emitting element.

For example, the first transfer line A21 and the fourth transfer line A24 are distributed axially symmetrically. For example, the second transfer line A22 and the third transfer line A23 are distributed axially symmetrically. For example, the symmetry axis of the first transfer line A21 and the fourth transfer line A24 and the symmetry axis of the second transfer line A22 and the third transfer line A23 are the same symmetry axis.

For example, the first transfer line A21, the second transfer line A22, the third transfer line A23 and the fourth transfer line A24 are all L-shaped traces. For example, the L-shaped trace includes a first section extending along the first direction (e.g., the X direction) and a second section extending along a second direction (e.g., a Y direction), and the second direction is perpendicular to the first direction. As shown in FIG. 8B, the first transfer line A21 includes a first section A21a and a second section A21b, the second transfer line A22 includes a first section A22a and a second section A22b, the third transfer line A23 includes a first section A23a and a second section A23b, and the fourth transfer line A24 includes a first section A24a and a second section A24b.

For example, the length of the first section A22a of the second transfer line A22 and the length of the first section A23a of the third transfer line A23 are equal and both are the first length, the length of the first section A21a of the first transfer line A21 and the length of the first section A24a of the fourth transfer line A24 are equal and both are the second length, and the first length is greater than the second length.

For example, orthographic projections of the first sections A21a, A22a, A23a, and A24a on the base substrate 10 do not overlap with the orthographic projection of the capacitor plate C11 and the orthographic projection of the capacitor plate C12 on the base substrate 10. Orthographic projections of the second sections A21b, A22b, A23b and A24b on the base substrate 10 overlap with the orthographic projection of the capacitor plate C11 and the orthographic projection of the capacitor plate C12 on the base substrate 10.

For example, the first transfer line A21 is connected to the corresponding light-emitting element through a fifth via hole H5, and the fifth via hole H5 is located in the first section A21a of the first transfer line A21. The second transfer line A22 is connected to the corresponding light-emitting element through a sixth via hole H6, and the sixth via hole H6 is located in the first section A22a of the second transfer line A22. The third transfer line A23 is connected to the corresponding light-emitting element through a seventh via hole H7, and the seventh via hole H7 is located in the first section A23a of the third transfer line A23. The fourth transfer line A24 is connected to the corresponding light-emitting element through an eighth via hole H8, and the eighth via hole H8 is located in the first section A24a of the fourth transfer line A24.

Through the above layout, the signal interference and signal delay can be effectively reduced, and the processing difficulty can be reduced and the reliability can be improved.

Figure 9A:
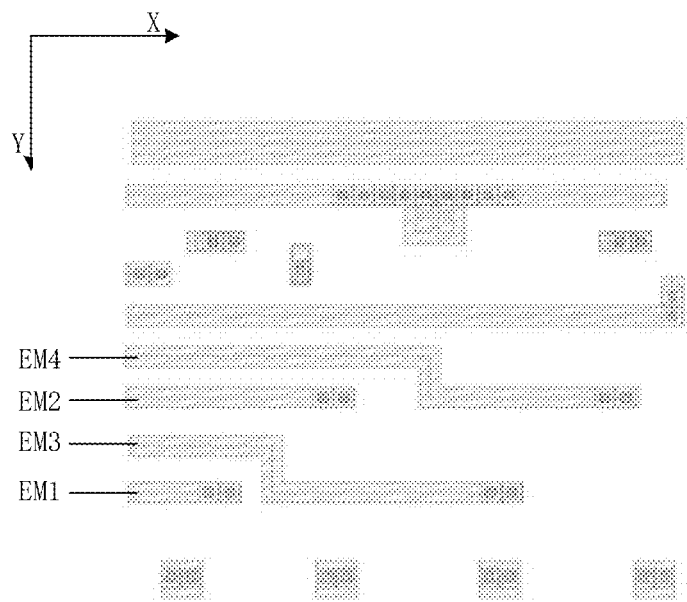
FIG. 9A is a plane view of a second metal layer of a display substrate provided by some embodiments of the present disclosure.
Figure 9B:
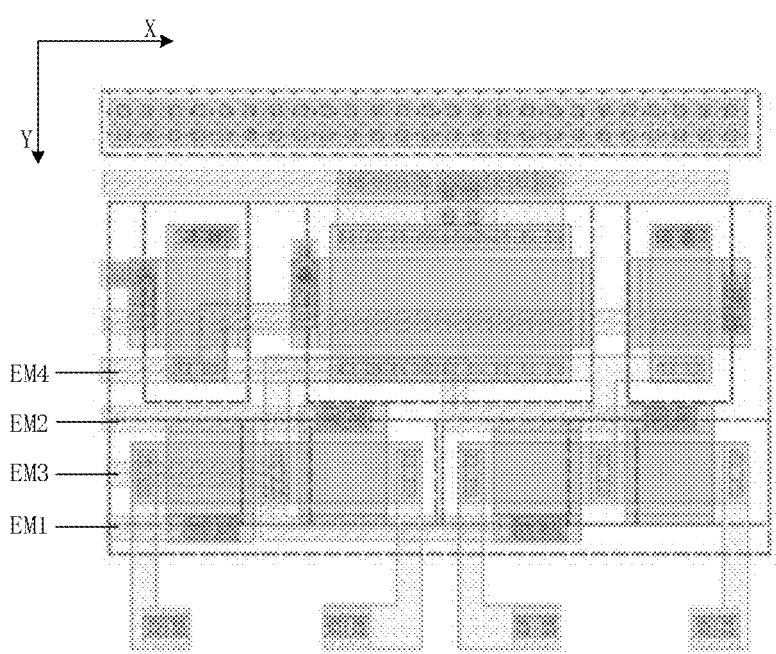
FIG. 9B is a plane view of stacking layer structures of FIG. 9A and FIG. 8C.
Figure 10A:
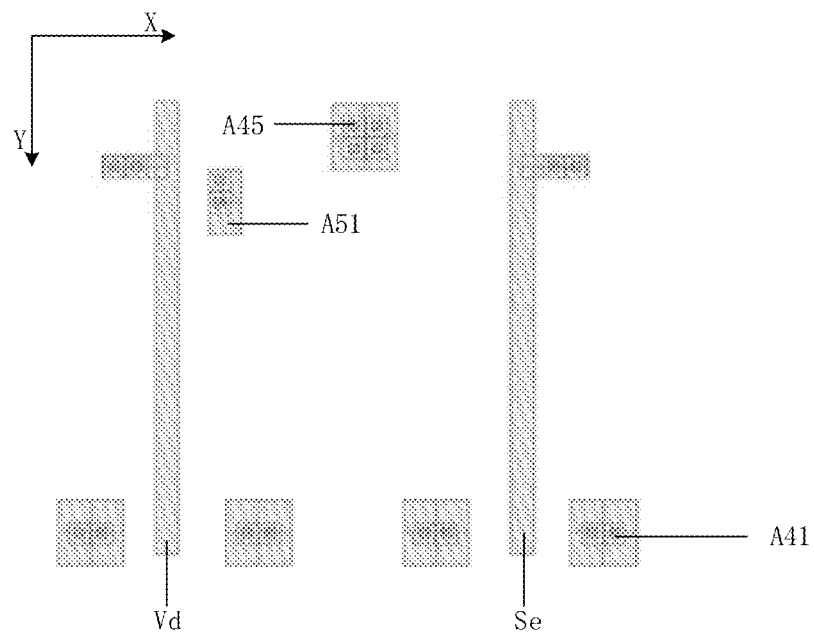
FIG. 10A is a plane view of a third metal layer of a display substrate provided by some embodiments of the present disclosure.
Figure 10B:
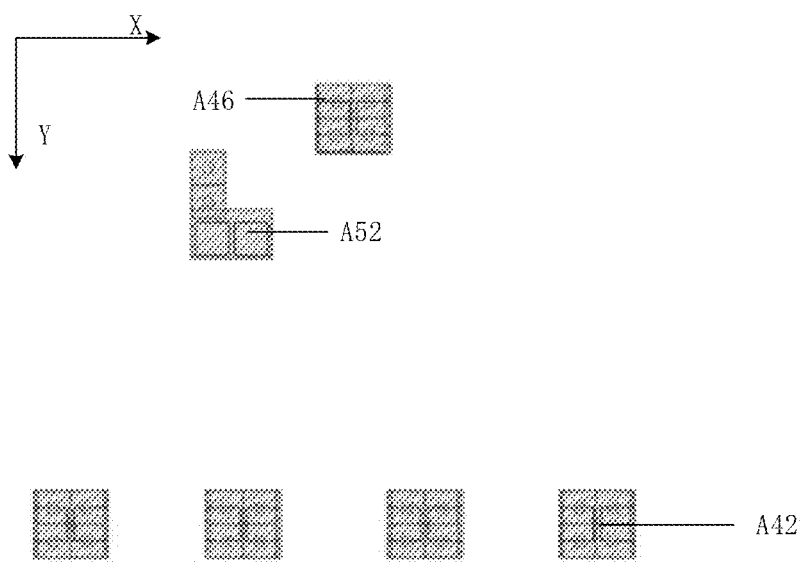
FIG. 10B is a plane view of a fourth metal layer of a display substrate provided by some embodiments of the present disclosure.
Figure 10C:
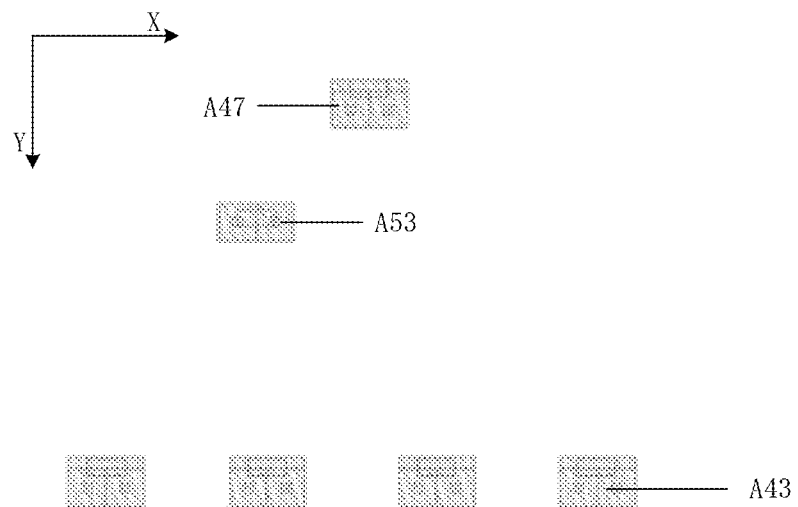
FIG. 10C is a plane view of a fifth metal layer of a display substrate provided by some embodiments of the present disclosure.
Figure 10D:
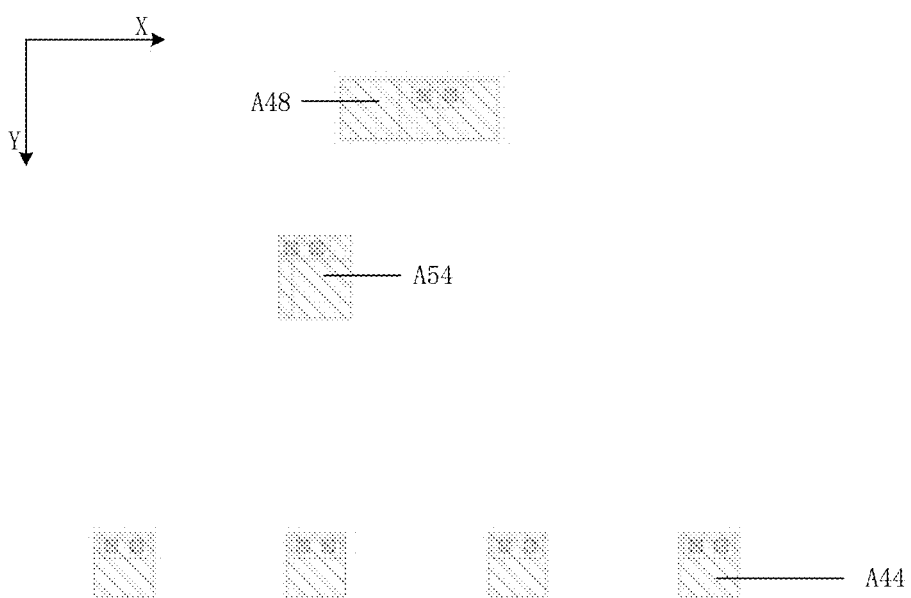
FIG. 10D is a plane view of a sixth metal layer of a display substrate provided by some embodiments of the present disclosure.
Figure 10E:
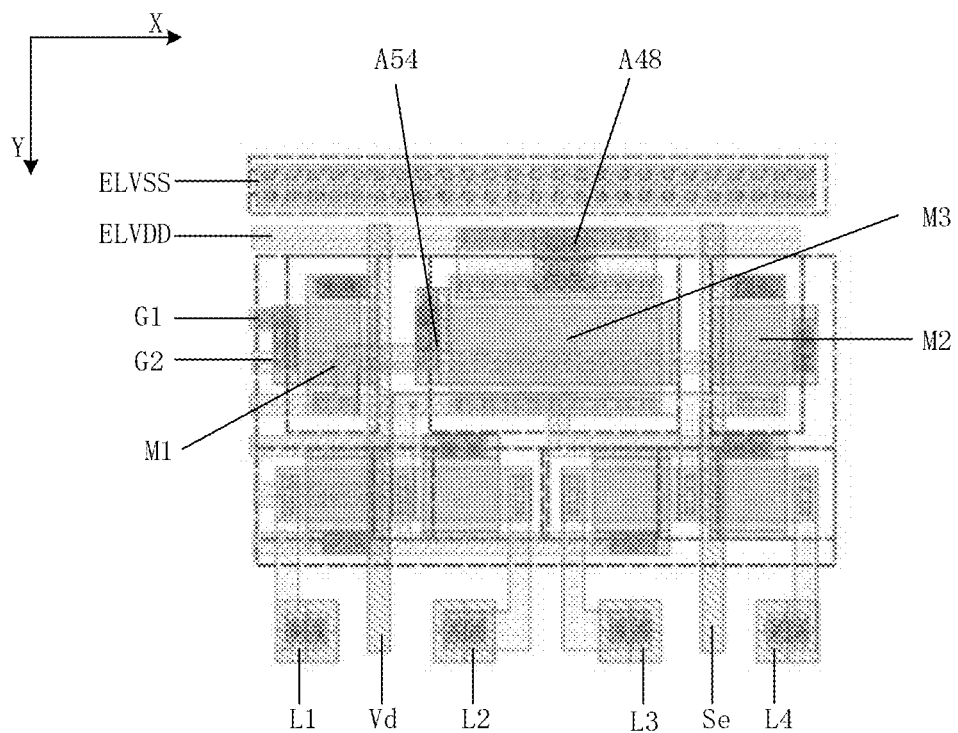
FIG. 10E is a plane view of stacking layer structures of FIG. 9B and FIG. 10A to FIG. 10D.

As shown in FIG. 9A and FIG. 9B, the first light-emitting control signal line EM1, the second light-emitting control signal line EM2, the third light-emitting control signal line EM3, and the fourth light-emitting control signal line EM4 are connected to the gate electrode M42 of the first light-emitting control transistor M4, the gate electrode M52 of the second light-emitting control transistor M5, the gate electrode M62 of the third light-emitting control transistor M6, and the gate electrode M72 of the fourth light-emitting control transistor M7, respectively, so as to respectively transmit the light-emitting control signals.

As shown in FIG. 10A to FIG. 10E, the data line Vd and the sensing signal line Se are spaced apart from each other and extend along the second direction on the base substrate 10, and the second direction is perpendicular to the first direction. For example, the first direction is the X direction and the second direction is the Y direction. An orthographic projection of the data line Vd on the base substrate 10 and an orthographic projection of the sensing signal line Se on the base substrate 10 are located on different sides of the orthographic projection of the third transistor M3 on the base substrate 10. The orthographic projection of the data line Vd on the base substrate 10 is located between the orthographic projection of the first transistor M1 on the base substrate 10 and the orthographic projection of the third transistor M3 on the base substrate 10. The orthographic projection of the sensing signal line Se on the base substrate 10 is located between the orthographic projection of the second transistor M2 on the base substrate 10 and the orthographic projection of the third transistor M3 on the base substrate 10.

For example, the transfer electrodes A41, A42, A43, and A44 are stacked in different film layers and electrically connected in turn, thereby connecting the second electrode M74 of the fourth light-emitting control transistor M7 to the light-emitting element L4 which is stacked on the transfer electrode A44. The light-emitting elements L1, L2, and L3 are also connected to the corresponding light-emitting control transistors in a similar way.

For example, the transfer electrodes A45, A46, A47, and A48 are stacked in different film layers and electrically connected in turn, thereby connecting the first electrode M33 of the third transistor M3 to the second capacitor plate C12 of the storage capacitor C1 and also connecting the first electrode M33 of the third transistor M3 to the first voltage line ELVDD. The transfer electrodes A51, A52, A53, and A54 are stacked in different film layers and electrically connected in turn, thereby connecting the gate electrode M32 of the third transistor M3 to the first capacitor plate C11 of the storage capacitor C1.

For example, the first scanning line G1 and the second scanning line G2 extend substantially along the first direction and are connected to the gate electrode M12 of the first transistor M1 and the gate electrode M22 of the second transistor M2, respectively. The first voltage line ELVDD extends along the first direction and is connected to the transfer electrode A48.

As shown in FIG. 11A and FIG. 11B, the storage capacitor C1 adopts an MIM capacitor, that is, a plate capacitor. The two capacitor plates of the storage capacitor C1 include a first capacitor plate C11 and a second capacitor plate C12. An orthographic projection of the second capacitor plate C12 on the base substrate 10 covers an orthographic projection of the first capacitor plate C11 on the base substrate 10. For example, the layer structure shown in FIG. 11A and FIG. 11B is arranged above the layer structure shown in FIG. 10E.

The first capacitor plate C11 is connected to the first transfer electrode TM1 through a first group of via holes TV1. The orthographic projection of the first transfer electrode TM1 on the base substrate 10 and orthographic projections of the first group of via holes TV1 on the base substrate 10 are all located in the orthographic projection of the first capacitor plate C11 on the base substrate 10.

The second capacitor plate C12 is connected to the second transfer electrode TM2 through a second group of via holes TV2. The orthographic projection of the second transfer electrode TM2 on the base substrate 10 and orthographic projections of the second group of via holes TV2 on the base substrate 10 are all located in the orthographic projection of the second capacitor plate C12 on the base substrate 10, and do not overlap with the orthographic projection of the first capacitor plate C11 on the base substrate 10. There is a gap between the orthographic projection of the second transfer electrode TM2 on the base substrate 10 and the orthographic projection of the first capacitor plate C11 on the base substrate 10.

For example, transfer electrodes A61, A62, A63, and A64 are used to connect the light-emitting elements L1-L4 to other transfer electrodes below the transfer electrodes A61, A62, A63, and A64, respectively.

It should be noted that one or more insulating layers can be arranged between the layer structures as shown in FIG. 6 and FIG. 7A to FIG. 11B according to requirements, and the arrangement of insulating layers can refer to the conventional design, which will not be described in detail here.

In the embodiments of the present disclosure, the pixel circuit 30 realizes capacitance multiplexing, so that one storage capacitor C1 corresponds to a plurality of pixel units 20, and only one capacitor needs to be set in the area occupied by the plurality of pixel units 20 on the base substrate 10, so that the area of the capacitor can be increased, which is beneficial to the voltage maintenance of the capacitor. Furthermore, because the signal (e.g., the data signal) transmitted by the first transistor M1 and the signal (e.g., the sensing signal) transmitted by the second transistor M2 are usually jumping signals, by enabling the orthographic projection of the capacitor plate of the storage capacitor C1 to at least partially cover the orthographic projection of the first transistor M1 and the orthographic projection of the second transistor M2, the influence of the pixel circuit 30 on the light-emitting element (e.g., the OLED) can be shielded or weakened by the capacitor plate, thereby improving the display quality.

It should be noted that the transistors used in the embodiments of the present disclosure can all be thin film transistors, field effect transistors or other switching devices with the same characteristics. The source electrode and the drain electrode of the transistor used here can be symmetrical in structure, so there is no difference in structure between the source electrode and the drain electrode. In the embodiments of the present disclosure, in order to distinguish the two electrodes of the transistor except the gate electrode, one electrode is directly described as the first electrode and the other electrode is the second electrode.

In addition, the transistors in the embodiments of the present disclosure are all explained by taking an N-type transistor as an example. In this case, the first electrode of the transistor is the drain electrode and the second electrode is the source electrode. It should be noted that the present disclosure includes but is not limited to this case. For example, one or more transistors in the display substrate 100 provided by the embodiments of the present disclosure can also adopt a P-type transistor, in which case, the first electrode of the transistor is the source electrode and the second electrode is the drain electrode, and as long as electrodes of the selected type of transistors are connected with reference to electrodes of corresponding transistors in the embodiments of the present disclosure and the corresponding voltage terminals are provided with a corresponding high voltage or a corresponding low voltage. When using N-type transistor, indium gallium zinc oxide (IGZO) can be used as an active layer of the thin film transistor. Compared with low temperature poly silicon (LTPS) or amorphous silicon (such as hydrogenated amorphous silicon) which serves as the active layer of the transistor, it can effectively reduce the size of the transistor and prevent leakage current.

In the embodiments of the present disclosure, the term "an operating level" refers to a level at which the corresponding transistor is turned on, and the term "a non-operating level" refers to a level at which the corresponding transistor is turned off. For example, the operating level can also be called an active level, and the non-operating level can also be called an invalid level.

At least one embodiment of the present disclosure also provides a display device. The pixel circuit in the display device realizes capacitor multiplexing, so that one storage capacitor corresponds to a plurality of pixel units, and only one capacitor needs to be set in the area occupied by the plurality of pixel units on the base substrate, so that the area of the capacitor can be increased, which is beneficial to the voltage maintenance of the capacitor, and thus the display quality can be improved.

Figure 12:
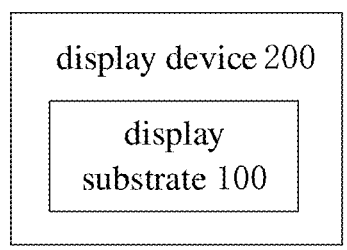
FIG. 12 is a schematic block diagram of a display device provided by some embodiments of the present disclosure.

FIG. 12 is a schematic block diagram of a display device provided by some embodiments of the present disclosure. As shown in FIG. 12, the display device 200 includes a display substrate 100, and the display substrate 100 is the display substrate provided by any embodiment of the present disclosure. For example, the display device 200 can be any product or component with a display function, such as a smart wearable device, a virtual reality device, an augmented reality device, a TV set, a display, a mobile phone, a tablet computer, a notebook computer, a digital photo frame, a navigator, etc., and the embodiments of the present disclosure are not limited to this case. The technical effects of the display device 200 can be referred to the corresponding description of the display substrate 100 in the above embodiments, which will not be repeated herein again.

At least one embodiment of the present disclosure also provides a method for driving the display substrate, and the driving method is used to drive the display substrate provided by any embodiment of the present disclosure. By using this driving method, the voltage of the capacitor can be maintained, thus improving the display quality.

Figure 13:
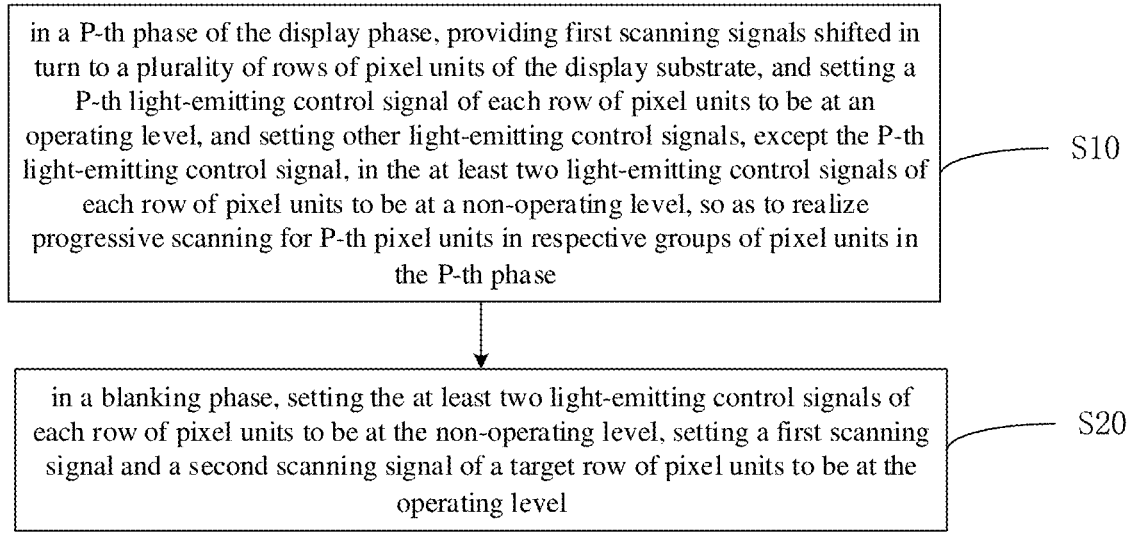
FIG. 13 is a flowchart of a method for driving a display substrate provided by some embodiments of the present disclosure.

FIG. 13 is a flowchart of a method for driving a display substrate provided by some embodiments of the present disclosure. As shown in FIG. 13, in some embodiments, the driving method includes following operations.

Step S10: in a P-th phase of the display phase, providing first scanning signals shifted in turn to a plurality of rows of pixel units of the display substrate, and setting a P-th light-emitting control signal of each row of pixel units to be an operating level, and setting other light-emitting control signals, except the P-th light-emitting control signal, in at least two light-emitting control signals of each row of pixel units to be a non-operating level, so as to realize progressive scanning for the P-th pixel units in respective groups of pixel units in the P-th phase, where 1≤P≤N and P is an integer.

For example, the at least two pixel units included in each group of pixel units include a first pixel unit to an N-th pixel unit, the above-mentioned at least two light-emitting control signals include a first light-emitting control signal to an N-th light-emitting control signal, and one frame of display phase comprises a first phase to an N-th phase, and N is a positive integer.

For example, in each phase from the first phase to the N-th phase, the first scanning signals corresponding to pixel units in a same row all have pulse waveforms with an operating level. In the display phase, an amount of the pulse waveforms of the first scanning signal corresponding to pixel units in the same row is N, that is, the first scanning signal corresponding to the pixel units in the same row are turned on N times in one display phase.

For example, in some examples, the driving method may further include the following operations.

Step S20: in a blanking phase, setting the at least two light-emitting control signals of each row of pixel units to be at a non-operating level, setting a first scanning signal and a second scanning signal of a target row of pixel units to be at an operating level, and the target row of pixel units being pixel units to be detected.

Figure 14:
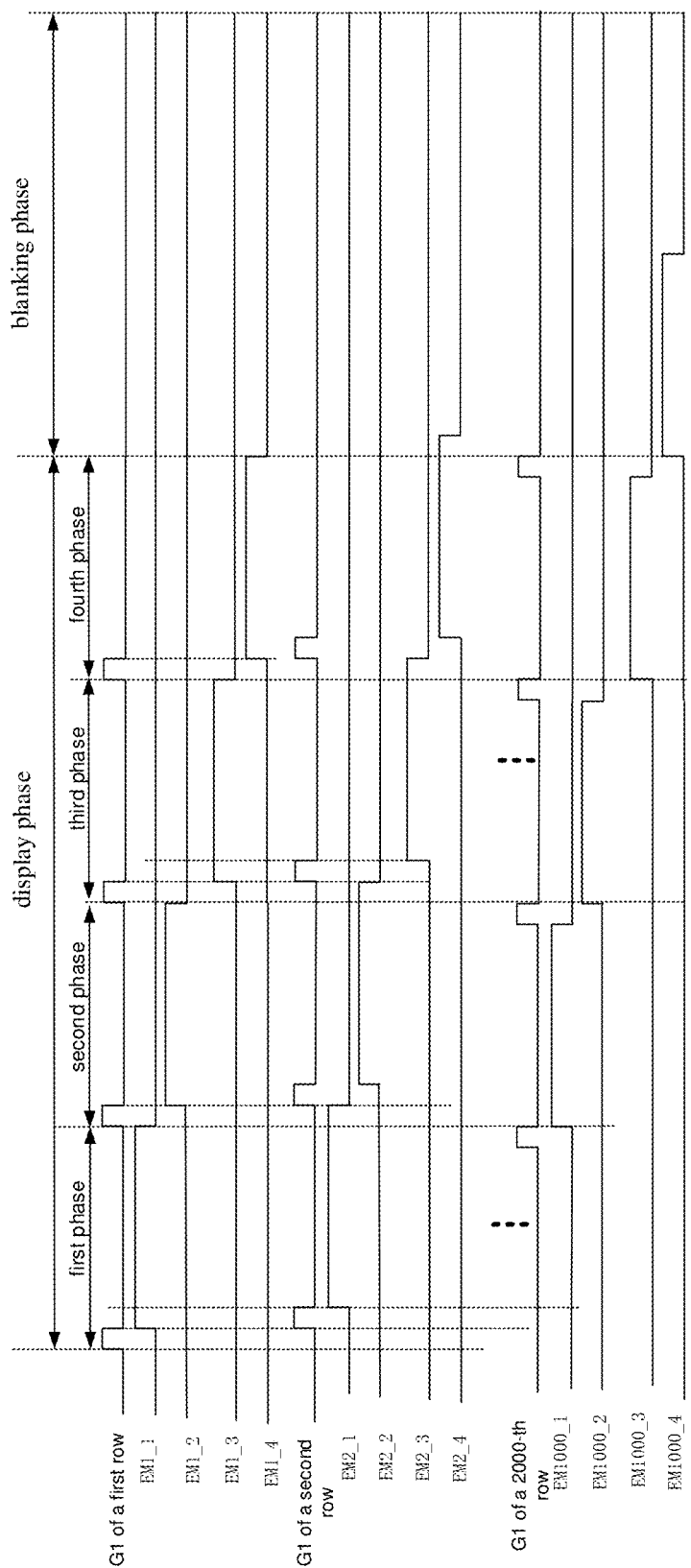
FIG. 14 is a driving timing diagram of a display substrate provided by some embodiments of the present disclosure.

FIG. 14 is a driving timing diagram of a display substrate provided by some embodiments of the present disclosure. Next, the driving method shown in FIG. 13 is described with reference to FIG. 14.

For example, in this example, it is taking as an example that the pixel resolution of the display substrate 100 is 4000*2000. For example, assuming that a refresh rate is 90 Hz, a duration of one frame is 11.1 ms. In one frame, 10 ms is used for displaying and light-emitting, and 1.1 ms is used as the blanking phase for compensating and sensing. For example, the timing is used to drive the display substrate 100 as shown in FIG. 2 to FIG. 5A. In the display substrate 100, every four pixel units 20 are a group, and each pixel circuit 30 drives a corresponding group of pixel units 20.

As shown in FIG. 14, in a quarter of the display phase of each frame, that is, in the first phase, the first scanning signal G1 of the first row is at an active level (e.g., a high level), and the first row receives 1000 data signals. Because every four pixel units 20 are a group and share one pixel circuit 30, although the resolution is 4000*2000, only 1000 data lines need to be set. At this time, all the first light-emitting control signals EM1 in the first row of pixel units 20 are at an active level, while the second light-emitting control signal EM2, the third light-emitting control signal EM3, and the fourth light-emitting control signal EM4 are all at an invalid level. The first pixel unit 20 of each group of pixel units 20 emits light (a total of 1000 pixel units 20 emit light, and other pixel units 20 in the same row do not emit light temporarily).

Then, the first scanning signal G1 of the second row is at an active level, the first light-emitting control signal EM1 of the second row is at an active level, and the first pixel unit 20 (1000 in total) of each group of pixel units 20 in the second row starts to emit light. In a similar way, and so on, until the first scanning signal G1 of the 2000-th row is at an active level, then the first light-emitting control signal EM1 of the 2000-th row is at an active level, and the first pixel unit 20 (1000 in total) of each group of pixel units 20 in the 2000-th row emits light. Thus, in the first phase, progressive scanning for the first pixel units 20 in respective groups of pixel units 20 is realized.

During ¼ to ½ of the display phase of each frame, that is, in the second phase, while the first scanning signal G1 of the 2000-th row becomes a low level, the first scanning signal G1 of the first row becomes an active level (for example, a high level) again, and the first row receives 1000 data signals. At this time, all the second light-emitting control signals EM2 in the first row of pixel units 20 are at an active level, while the first light-emitting control signal EM1, the third light-emitting control signal EM3, and the fourth light-emitting control signal EM4 are all at an invalid level. The second pixel unit 20 of each group of pixel units 20 emits light (a total of 1000 pixel units 20 emit light, and other pixel units 20 in the same row do not emit light temporarily).

Then, the first scanning signal G1 of the second row is at an active level, the second light-emitting control signal EM2 of the second row is at an active level, and the second pixel unit 20 (1000 in total) of each group of pixel units 20 in the second row starts to emit light. In a similar way, and so on, until the first scanning signal G1 of the 2000-th row is at an active level, then the second light-emitting control signal EM2 of the 2000-th row is at an active level, and the second pixel unit 20 (1000 in total) of each group of pixel units 20 in the 2000-th row emits light. Thus, in the second phase, progressive scanning for the second pixel units 20 in respective groups of pixel units 20 is realized.

During ½ to ¾ of the display phase of each frame, that is, in a third phase, while the first scanning signal G1 of the 2000-th row becomes a low level, the first scanning signal G1 of the first row becomes an active level (for example, a high level) again, and the first row receives 1000 data signals. At this time, all the third light-emitting control signals EM3 in the first row of pixel units 20 are at an active level, while the first light-emitting control signal EM1, the second light-emitting control signal EM2, and the fourth light-emitting control signal EM4 are all at an invalid level. The third pixel unit 20 of each group of pixel units 20 emits light (a total of 1000 pixel units 20 emit light, and other pixel units 20 in the same row do not emit light temporarily).

Then, the first scanning signal G1 of the second row is at an active level, the third light-emitting control signal EM3 of the second row is at an active level, and the third pixel unit 20 (1000 in total) of each group of pixel units 20 in the second row starts to emit light. In a similar way, and so on, until the first scanning signal G1 of the 2000-th row is at an active level, then the third light-emitting control signal EM3 of the 2000-th row is at an active level, and the third pixel unit 20 (1000 in total) of each group of pixel units 20 in the 2000-th row emits light. Thus, in the third phase, progressive scanning for the third pixel units 20 in respective groups of pixel units 20 is realized.

During ¾~1 of the display phase of each frame, that is, in a fourth phase, while the first scanning signal G1 of the 2000-th row becomes a low level, the first scanning signal G1 of the first row becomes an active level (for example, a high level) again, and the first row receives 1000 data signals. At this time, all the fourth light-emitting control signals EM4 in the first row of pixel units 20 are at an active level, while the first light-emitting control signal EM1, the second light-emitting control signal EM2, and the third light-emitting control signal EM3 are all at an invalid level. The fourth pixel unit 20 of each group of pixel units 20 emits light (a total of 1000 pixel units 20 emit light, and other pixel units 20 in the same row do not emit light temporarily).

Then, the first scanning signal G1 of the second row is at an active level, the fourth light-emitting control signal EM4 of the second row is at the active level, and the fourth pixel unit 20 (1000 in total) of each group of pixel units 20 in the second row starts to emit light. In a similar way, and so on, until the first scanning signal G1 of the 2000-th row is at an active level, then the fourth light-emitting control signal EM4 of the 2000-th row is at an active level, and the fourth pixel unit 20 (1000 in total) of each group of pixel units 20 in the 2000-th row emits light. Thus, in the fourth phase, progressive scanning for the fourth pixel units 20 in respective groups of pixel units 20 is realized.

In the embodiments of the present disclosure, in the display phase of one frame, the first scanning signal G1 of each row is at an active level four times, and each time a different light-emitting control signal is correspondingly at an active level, only ¼ of the pixel units 20 in the same row emit light at the same time. The first scanning signal G1 of each row can be shifted, and the light-emitting control signal of each row can also be shifted. For example, in some examples, if intelligent display is required, the first scanning signal G1 and the corresponding light-emitting control signal can be turned on for any row to realize intelligent display.

For example, in the blanking phase, if compensation and sensing is needed for a certain row, the light-emitting control signals of pixel units 20 in each row are all at a non-operating level, and the first scanning signal G1 and the second scanning signal G2 of pixel units 20 in the target row (that is, the row to be sensed) are at an operating level (that is, the effective level), so that compensation and sensing can be realized. For example, the target row of pixel unit 20 is the row of the pixel unit 20 to be detected.

It should be noted that, in the above-mentioned embodiments, it is explained that each group of pixel units 20 includes four pixel units 20 as an example, but this case does not constitute a limitation to the embodiments of the present disclosure. When the number of pixel units 20 contained in each group of pixel units 20 is other numerical values, such as 2, 3, 5, etc., the display phase is correspondingly divided into 2 phases, 3 phases or 5 phases, etc., which can be determined according to actual requirements, and the embodiments of the present disclosure are not limited by this case. The technical effects of the driving method can refer to the corresponding description of the display substrate 100 in the above-mentioned embodiments, which will not be repeated herein again.

At least one embodiment of the present disclosure also provides a source driving circuit. The source driving circuit can reduce an amount of digital-to-analog converters, effectively reduce the occupied area and reduce the production cost, and is suitable for various pixel circuits.

For high PPI display, the source driver faces many problems. Taking the display substrate with a resolution of 4000*2000 as an example, for a large-size OLED display, because the source driver and the pixel unit are separate, the problem of too many channels can be solved by allocating multiple source drivers. However, for the silicon-based OLED display substrate, the source driver and the pixel unit are manufactured on the same device, so the packaging operation can be omitted, but the resolution of 4000*2000 means that 4000 channels are needed, so 4000 groups of digital-to-analog converters (DACs) and buffers are needed. The DAC and buffer usually occupy about 70% of the chip area of the source driver. If 4000 DACs and buffers are designed on the silicon base substrate, it may undoubtedly greatly increase the proportion of the driving portion in the whole silicon base substrate, even equal to the area of the display region (an AA region), which cannot meet the production and use requirements. Moreover, 4000 groups of DACs and buffers may not only increase the occupied area, but also multiplied increase the power consumption. For silicon-based micro-display, the power consumption is one of the core indicators, especially for the high PPI display, it is necessary to reduce the power consumption, and the large power consumption cannot be accepted.

Figure 15:
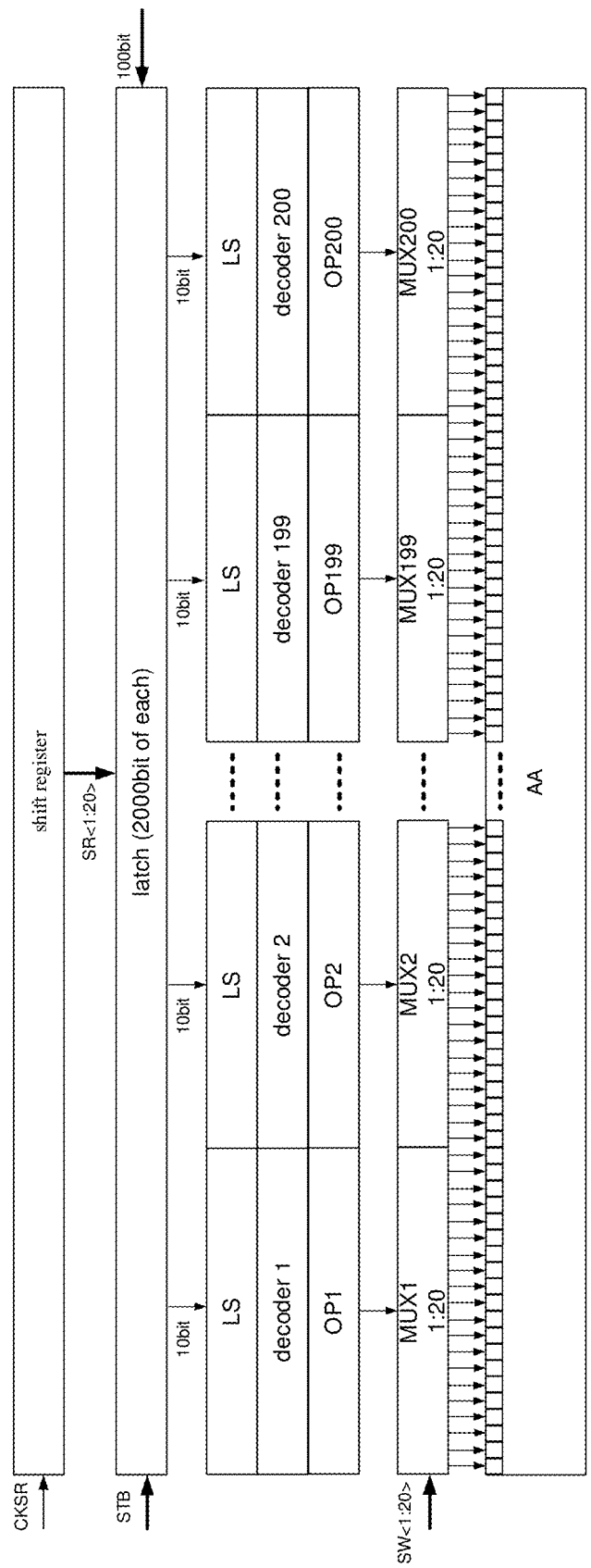
FIG. 15 is a schematic diagram of a source driving circuit provided by some embodiments of the present disclosure.

To solve the above problems, the embodiments of the present disclosure provide a source driving circuit. FIG. 15 is a schematic diagram of a source driving circuit provided by some embodiments of the present disclosure. As shown in FIG. 15, an amount of DACs is reduced by using multiplexers (MUX). Taking the display substrate with a resolution of 4000*2000 as an example, the amount of DACs and buffers needed is 200. By adding MUX, the occupied area can be reduced and the output demand of 4000 channels can be met. For example, each MUX is connected to 20 channels, and each MUX is a 1:20 multiplexer. Therefore, the output of 4000 channels can be realized by using 200 MUX.

For example, as shown in FIG. 15, the shift register and the latch have the same circuit structure as the common source driver, but the difference is that in the common source driver STB signal of every row is turned on only once, and the source driver transmits data of one row at each time.

However, in the source driving circuit provided by the embodiments of the present disclosure, STB signal of every row is turned on several times, so as to correspondingly transmit multiple rows of data.

For example, for a 4000*2000 display substrate, the latch releases 40000 bit of data (assuming the DAC is 10 bit) each time. If the pixel circuit shown in FIG. 1 is adopted, the STB signal is turned on 20 times in the scanning duration of one row, and each time 2000 bit of data are transmitted, the DAC needs to undergo 20 conversions, and each time the data signal is output to the corresponding channel through the 1:20 MUX. 200 data signals are generated each time, and 4000 data signals are generated 20 times in total, thus providing the data signals needed by all pixel units in one row. In this case, the pixel units in the same row are written with data signals at the same time and emit light at the same time.

If the pixel circuit 30 shown in FIG. 5A is adopted, ¼ pixel units in one row of pixel units need to write data in the scanning duration of one row, and the remaining ¾ pixel units do not need to write data in this scanning duration. Therefore, the STB signal is turned on five times, and at each time, 2000 bit is transmitted, the DAC needs to be converted five times, at each time the data signal is output to the corresponding channel through the 1:5 MUX, and at each time 200 data signals are generated, and a total of 1000 data signals are generated after five times, thus providing the data signals needed by ¼ pixel units in one row of pixel units.

At least one embodiment of the present disclosure also provides a current adjustment method. By using this current adjustment method, the current value can be dynamically adjusted in real time, and the power consumption can be effectively reduced, which is beneficial to system integration.

For a low power consumption design, the power consumption is usually reduced by controlling the current of buffer, but it is generally a relatively fixed processing mode. For example, it can be divided into a normal display mode and an energy-saving mode, the current is 100% in the normal display mode and is 80% in the energy-saving mode, or when writing data, the current is relatively large, and the current is relatively small without writing data. Although these processing methods can reduce the power consumption to a certain extent, the reduction degree of power consumption is limited.

Aiming at the above problems, the embodiments of the present disclosure provide a current adjustment method, which can dynamically adjust the current, effectively reduce power consumption, facilitate system integration and improve reliability.

Figure 16:
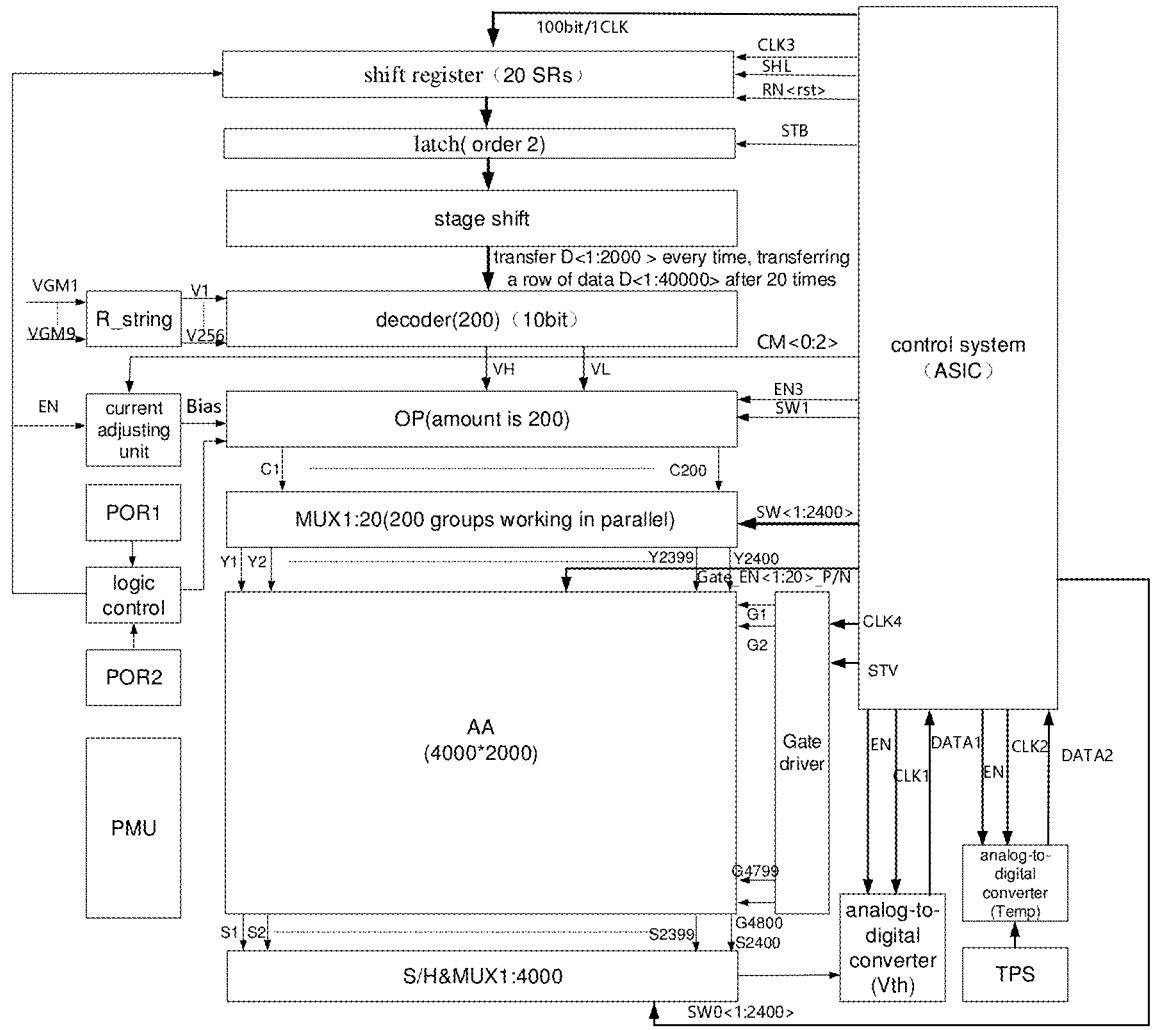
FIG. 16 is a schematic diagram of a display driving architecture provided by some embodiments of the present disclosure.

FIG. 16 is a schematic diagram of a display driving architecture provided by some embodiments of the present disclosure. As shown in FIG. 16, the control system provides a control signal CM<0:2> to a current adjusting unit to adjust a bias current Bias. For example, the control signal CM<0:2> may be a 3 bit signal. By adjusting the bias current Bias through the control signal, and then controlling the current of the buffer, the purpose of reducing power consumption can be achieved.

For example, the control system pre-stores data signals of two rows of pixel units (for example, a present row and a next row), and determines the value of the control signal CM<2:0> by comparing the average brightness of each row of the two rows of pixel units and the maximum difference of the data signals at the same position. For example, in some examples, the current can be divided into 8 steps, and the difference value of each step is equal (assuming that the current changes from 1 μA to 8 μA). If the average brightness of pixel units in two adjacent rows is the same, and the maximum difference value of data signals in the same position is almost zero, a current magnitude of the present row is maintained as a current magnitude of the next row. If the average brightness of adjacent two rows of pixel units is very different, and the maximum difference of data signals at the same position is large (for example, from the lowest gray scale to the highest gray scale), the current of the next row is dynamically adjusted to 8 μA. In other cases, the current can take a middle range value according to the specific situation. Therefore, the current required by each row of pixel units is the optimal value actually needed at present, thus avoiding wasting power consumption and effectively reducing power consumption.

At least one embodiment of the present disclosure also provides a sensing circuit and a sensing method. By using the sensing circuit and the sensing method, the problems of poor compensation effect caused by charge sharing and capacitance deviation can be solved, the compensation error can be reduced, and the display effect can be improved.

Figure 17:
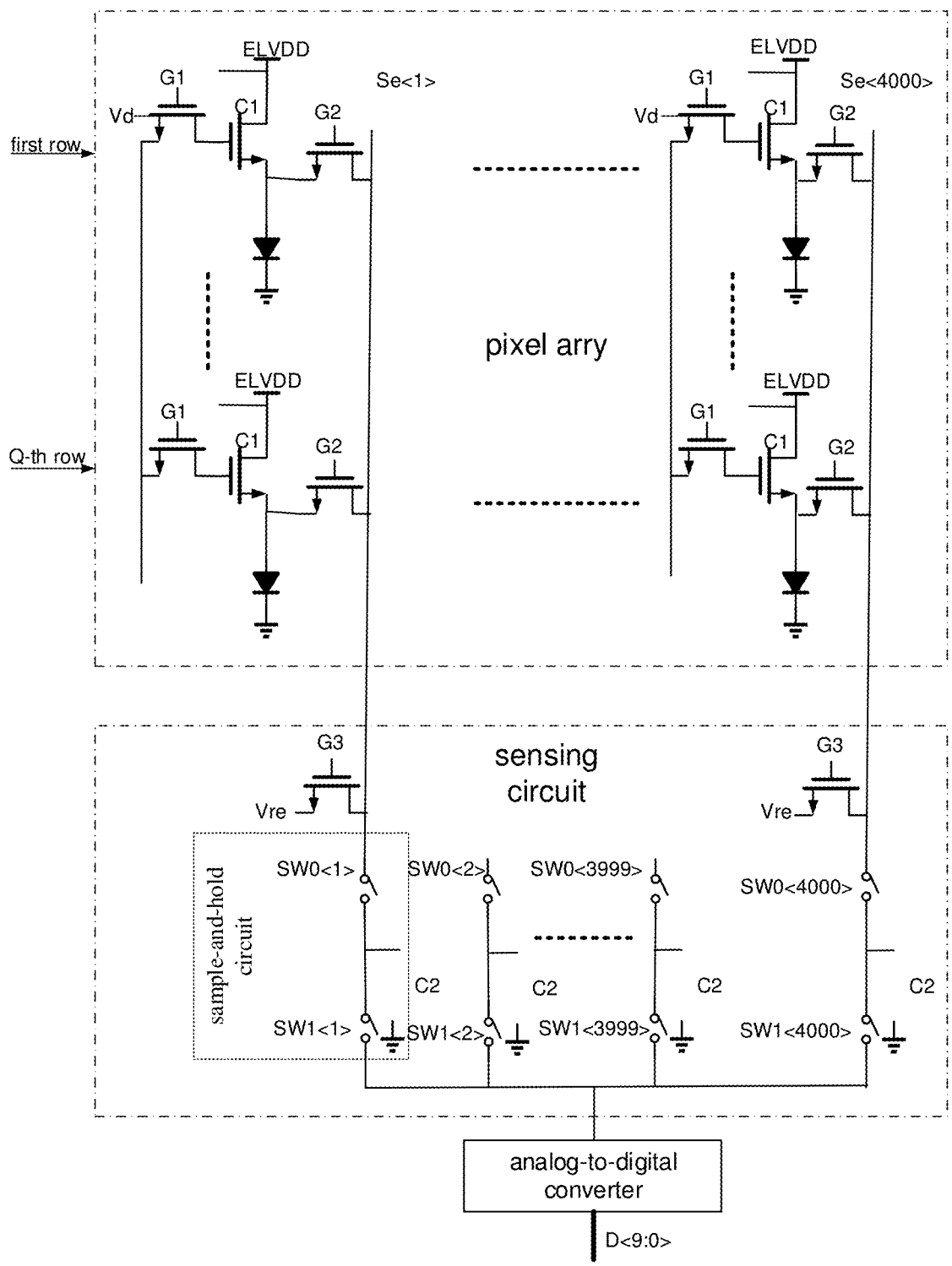
FIG. 17 is a schematic diagram of a sensing circuit provided by some embodiments of the present disclosure.

FIG. 17 is a schematic diagram of a sensing circuit provided by some embodiments of the present disclosure. As shown in FIG. 17, taking the resolution of the display substrate as 4000*2000 as an example, assuming that the pixel circuit shown in FIG. 1 is adopted, 4000 sensing signal lines Se are needed in this case. To save power consumption, only one analog-to-digital converter (ADC) can be used, so 4000 sample-and-hold circuits are needed. For example, during sensing, signals SW0<1:4000> are turned on at the same time, and the signals of 4000 sensing signal lines Se are collected into the corresponding sample-and-hold circuits. Signals SW1<1:4000> are turned on in turn, so that multiple signals are output through ADC in turn.

Figure 18:
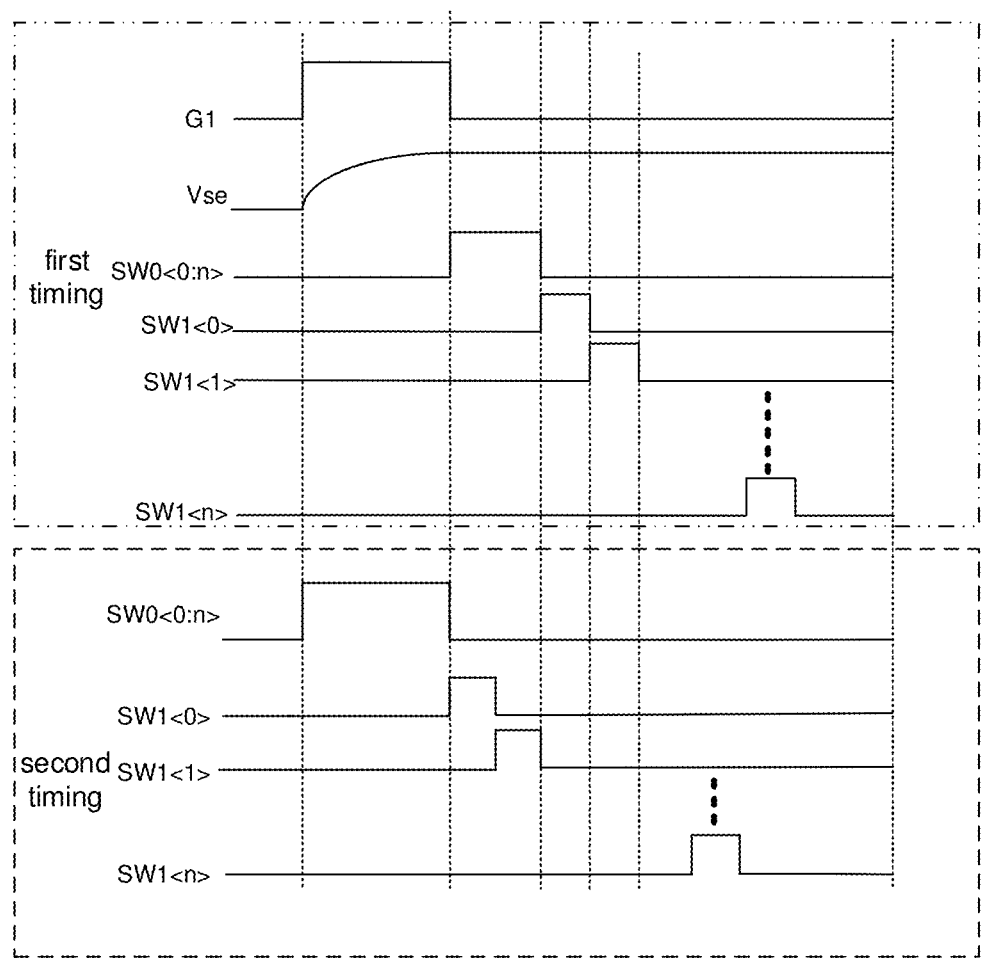
FIG. 18 is a comparison diagram of sensing timing provided by some embodiments of the present disclosure.

FIG. 18 is a comparison diagram of a sensing timing provided by some embodiments of the present disclosure. As shown in FIG. 18, in one driving method, the timing provided to the sensing circuit is a first timing. In the first timing, in the case where the first scanning signal G1 becomes an active level, the data signal charges the storage capacitor of the pixel circuit, and an anode voltage of the light-emitting element gradually increases. Due to a parasitic capacitance on the sensing signal line Se (for example, in the order of 1 pf, there are differences among different sensing signal lines Se), the anode of the light-emitting element finally stabilizes at a fixed value (assuming 2V), at this time, the signals SW0<1:4000> are all turned on, and the sampling capacitance C2 is also in the order of 1 pf. Because too large the sampling capacitor C2 may increase the charging duration and the chip area, too small the sampling capacitor C2 is not conducive to the stability of the sampling voltage, so the sampling capacitor C2 is usually set at the order of 1 pf.

In the case where the signals SW0<1:4000> are turned on, the capacitance on the sensing signal line Se and the sampling capacitance C2 may share the charge. Assuming that the capacitance on the sensing signal line Se and the sampling capacitance C2 are both about 1 pf, the voltage on the sampling capacitance C2 is IV after charge sharing. In fact, the capacitances on different sensing signal lines Se have deviations, which are not all equal. Assuming that the capacitance of the first sensing signal line Se<1> is 1 pf, the capacitance of the second sensing signal line Se<2> is 1.2 pf, and the capacitance of the third sensing signal line Se<3> is 0.8 pf, in the case where the sampling capacitors C2 are all 1 pf, after the signals SW0<1:4000> are turned on and the charge is shared, the corresponding voltages of the sampling capacitors C2 are 1V, 1.09V, and 0.89V, respectively. After that, SW1<1:4000> are turned on in turn, ADC is converted in turn, and finally different digital signals are obtained, while the values of these three sensing signal lines should be the same (assuming that the threshold voltage does not change, the sensed voltages are all 2V). It can be seen that the parasitic capacitance on the sensing signal line Se may directly cause the error of the sensing result.

In another driving method, the timing provided to the sensing circuit is a second timing, which can solve the above problems. In the second timing, while the first scanning signal G1 becomes an active level, the signals SW0<1:4000> are turned on at the same time. In this way, if the threshold voltage does not change and the same data signal is provided, the voltage values sensed by the sampling capacitor C2 are equal, thus avoiding the sensing result error caused by the parasitic capacitance difference of the sensing signal line Se.

As for the error of sampling capacitor C2 itself, as long as the input parasitic capacitance of ADC is not in the same order of magnitude, the error caused by charge sharing can be ignored. For example, the timing of capacitor calibration can also be increased to calibrate the capacitor before leaving the factory, so as to overcome the error caused by the deviation of sampling capacitor C2.

It should be noted that in the case where the signals SW1<1:4000> are turned on in turn, they can't overlap with each other, that is, two SW1 can't be turned on at the same time, so as to prevent the charge sharing from generating errors. In addition, the systematic error of ADC itself can be eliminated by calculating the difference. For example, before leaving the factory, the same data signal is provided in one frame, and the sensed data is used as an initial data of the whole display screen and stored in the system. When each sensing, it is compared with the initial data sensed at the first time, for example, the difference is calculated, and the difference reflects the aging of OLED, thus overcoming the influence of the error of ADC itself. Therefore, the compensation ability and display effect can be improved. This sensing circuit is suitable for both the pixel circuit shown in FIG. 1 and the pixel circuit shown in FIG. 5A. is only necessary to adjust the amount of sample-and-hold circuits correspondingly, for example, to enable the amount of the sample-and-hold circuits to be equal to the amount of the sensing signal lines.

At least one embodiment of the present disclosure also provides a display substrate and a driving method thereof. According to the display substrate and the driving method thereof, a partition independent display and a simultaneous display are realized by dividing the pixel units into display blocks, and a high-definition display in a gaze region and a low-definition display in a non-gaze region are realized by an eye-tracking technology, thereby realizing intelligent display and overcoming the bandwidth limitation faced by high PPI.

For silicon-based micro-display technology with high PPI, with the rapid increase of data volume in one frame, the requirements for system bandwidth and algorithm are gradually increasing. In the case where the hardware performance can't be significantly improved, a smart view can be used to improve the display effect, that is, the eye tracking technology can be used to locate the gaze region of the human eyes and divide the whole display into the gaze region and the non-gaze region. For the gaze region, it can be displayed in the high definition, while for the non-gaze region, multiple rows can be opened simultaneously to reduce the resolution. Therefore, under the same bandwidth, the gaze region can transmit more data.

According to the display substrate provided by the embodiments of the present disclosure, the division of the gaze region and the non-gaze region can be realized, thereby realizing intelligent display.

Figure 19:
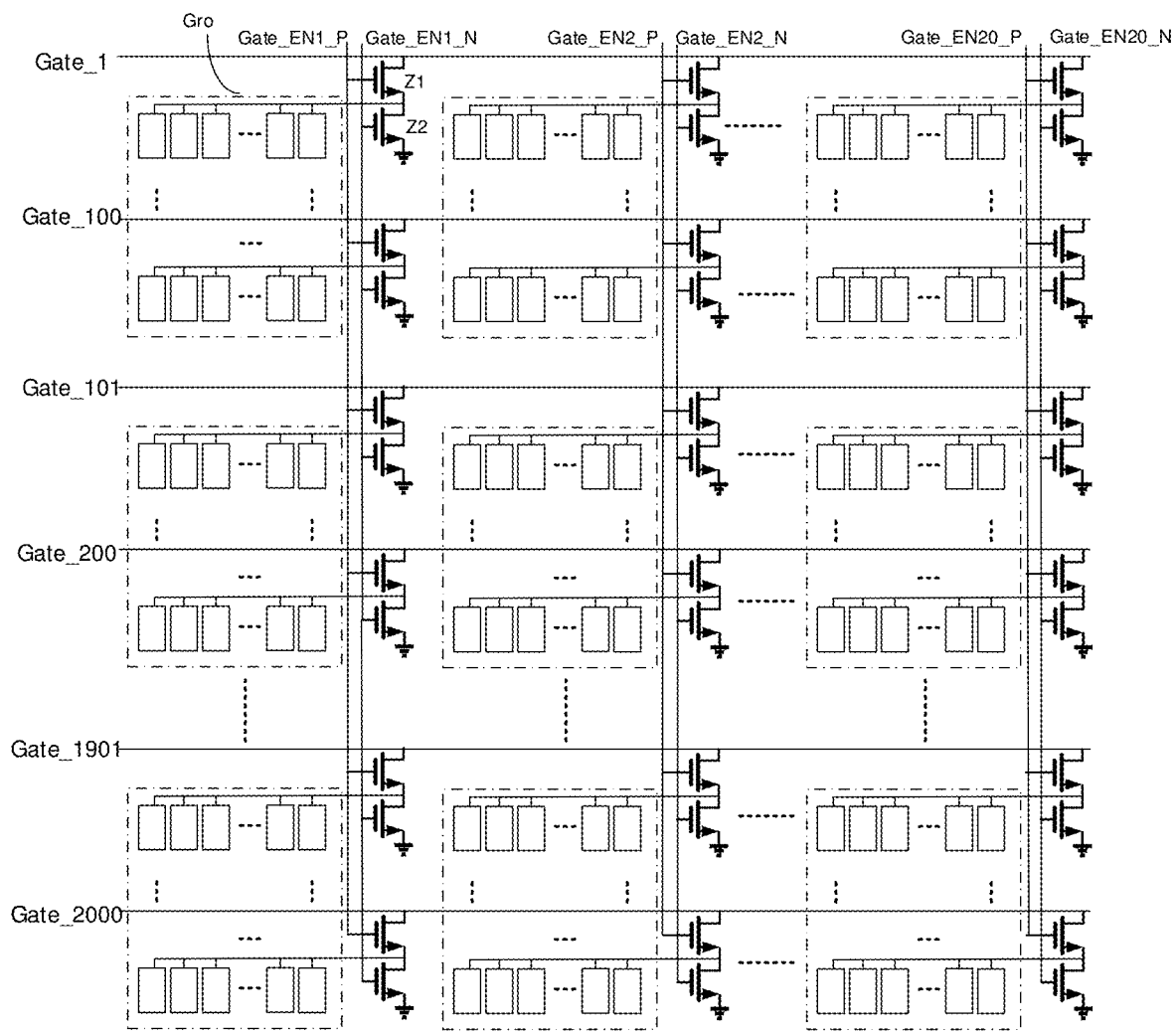
FIG. 19 is a layout schematic diagram of a display substrate provided by some embodiments of the present disclosure.

FIG. 19 is a layout schematic diagram of a display substrate provided by some embodiments of the present disclosure. As shown in FIG. 19, the AA region is divided into 20*20 display blocks Gro. Still taking the resolution of 4000*2000 as an example, each display block Gro includes 200*100 pixel units. In order to realize partition display, each display block Gro needs to be individually controlled, that is, each display block Gro can be displayed normally or separately. Therefore, an independent switch is set for each display block Gro, and a group of switches, namely a transistor Z1 and a transistor Z2, are added to each row of each display block Gro. In this example, each display block Gro includes 200 rows of pixel units, so each display block Gro requires 200 sets of switches. The transistor Z1 and the transistor Z2 are respectively controlled by a group of opposite signals, which are Gate_EN_N and Gate_EN_P. In the case where the signal Gate_EN_N is at a high level, the signal Gate_EN_P is at a low level. In the case where the signal Gate_EN_N is at a low level, the signal Gate_EN_P is at a high level. For example, the signal Gate_EN_P controls the transistor Z1 and the signal Gate_EN_N controls the transistor Z2. For example, in order to match the pixel circuit and reduce the area, the transistor Z1 and the transistor Z2 corresponding to each row of each display block Gro use the same NMOS transistors as the pixel circuit.

In a row direction, because there are 20 display blocks Gro, 20 groups of control signals are needed, a signal Gate_EN1_N and a signal Gate_EN1_P are a first group, a signal Gate_EN2_N and a signal Gate_EN2_P are a second group, and so on. In a column direction, each column display block Gro is controlled by the same group of control signals Gate_EN_N and Gate_EN_P.

In normal display, all Gate_EN<1:20>_P are at a high level, and each display block Gro receives the corresponding scanning signal Gate<1:2000>, and the scanning signal in the same row is the same. In the case where partition display is needed, the control signals Gate_EN<1:20>_N and Gate_EN<1:20>_P can be adjusted by determining the gaze region using the eye tracking technology.

For example, in some examples, assuming that the gaze region is at a fifth display block Gro and a sixth display block Gro in the first row, when the first 100 rows of display data are transmitted, the signal Gate_EN5_P and the signal Gate_EN6_P are set to be at a high level and the rest Gate_EN_P are set to be at a low level, then the pixel units in the fifth display block Gro and the sixth display block Gro are normally written with corresponding data signals and displayed. While the Gate_EN_P of other display blocks Gro is at a low level, and a ground potential is connected to each row of scanning lines in these display blocks Gro, resulting in that the gate electrodes of all pixel units in these display blocks Gro cannot be turned on and new data signals cannot be written, so that the OLED can keep the luminous brightness of the previous frame. Therefore, the gaze region can be displayed in high definition, while the non-gaze region keeps the luminous brightness of the previous frame.

For example, in other examples, for the non-gaze region which is located in the same row as the gaze region, the gate electrode of the pixel unit is turned on under the control of the signal Gate_EN_N and the signal Gate_EN_P, but the written data signals are different. For other non-gaze regions which are not in the same row as the gaze region, the gate electrodes of multiple rows of pixel units are turned on at the same time, thereby quickly refreshing and improving the frame rate.

For example, in other examples, data signals are provided to the gaze region and the non-gaze region respectively, and the high-definition data of the gaze region is refreshed firstly, and then the low-definition data of other non-gaze regions are refreshed.

It should be noted that in the embodiments of the present disclosure, the way of intelligent display is not limited to the way described above, and other arbitrary suitable ways can be adopted, the embodiments of the present disclosure are not limited to this case. For example, intelligent display can be realized by cooperating a front-terminal algorithm with Gate_EN<1:20>_N and Gate_EN<1:20>_P and data signals.

In this way, the display block Gro can be individually controlled, can be matched with the algorithm to separately display the gaze region and the non-gaze region, and is compatible with various intelligent display modes, such as multi-line simultaneous opening, arbitrary line opening and other functions, so as to realize the high-definition display effect of the human eye gaze region under a certain bandwidth, and reduce the resolution and power consumption in the non-gaze region.

For example, the circuits provided by the above embodiments, such as the pixel circuit, the source driving circuit, and the sensing circuit, can all be integrated on one chip, thus facilitating mass production and reducing costs.

For the present disclosure, the following statements should be noted.

(1) The accompanying drawings related to the embodiment(s) of the present disclosure involve only the structure(s) in connection with the embodiment(s) of the present disclosure, and other structure(s) can be referred to common design(s).

(2) In case of no conflict, embodiments or features in one embodiment or in different embodiments can be combined to obtain new embodiments.

What have been described above merely are specific implementations of the present disclosure, and the protection scope of the present disclosure is not limited thereto. The protection scope of the present disclosure should be based on the protection scope of the claims.

What is claimed is:

1. A display substrate, comprising:
a base substrate;
a plurality of pixel units on the base substrate; and
a plurality of pixel circuits on the base substrate,
wherein the plurality of pixel units are arranged in a plurality of rows and columns, and the plurality of pixel units are divided into a plurality of groups, each group of pixel units comprises at least two pixel units, and each pixel unit comprises a light-emitting element;
each pixel circuit is configured to drive a corresponding group of pixel units, and each pixel circuit comprises a driving circuit, a data writing circuit, a storage circuit, a sensing circuit, and a light-emitting control circuit;
the driving circuit is connected to the data writing circuit, the storage circuit, the sensing circuit, and the light-emitting control circuit, respectively, and is configured to control a value of a driving current;
the data writing circuit is configured to write a data signal into the driving circuit in response to a first scanning signal;
the storage circuit is configured to store the data signal written by the data writing circuit;
the sensing circuit is configured to connect the driving circuit to a sensing signal line in response to a second scanning signal;
the light-emitting control circuit is connected to the driving circuit and is respectively connected to at least two light-emitting elements of at least two pixel units of a corresponding group of pixel units, and the light-emitting control circuit is configured to apply the driving current to light-emitting elements of respective pixel units of the corresponding group of pixel units at different times in response to at least two light-emitting control signals; and
the light-emitting element is configured to emit light according to the driving current that is received;
the driving circuit comprises a control terminal, a first terminal, and a second terminal, and the first terminal of the driving circuit receives a first voltage of a first voltage terminal;
the data writing circuit is connected to the control terminal of the driving circuit, a first terminal of the storage circuit is connected to the control terminal of the driving circuit, a second terminal of the storage circuit is connected to the first terminal of the driving circuit, the sensing circuit is connected to the second terminal of the driving circuit, and the light-emitting control circuit is connected to the second terminal of the driving circuit;
the data writing circuit comprises a first transistor, the sensing circuit comprises a second transistor, the driving circuit comprises a third transistor, and the storage circuit comprises a storage capacitor;
a gate electrode of the third transistor serves as the control terminal of the driving circuit, a first electrode of the third transistor serves as the first terminal of the driving circuit, and a second electrode of the third transistor serves as the second terminal of the driving circuit;
a gate electrode of the first transistor is connected to a first scanning line to receive the first scanning signal, a first electrode of the first transistor is connected to a data line to receive the data signal, and a second electrode of the first transistor is connected to the gate electrode of the third transistor;
a gate electrode of the second transistor is connected to a second scanning line to receive the second scanning signal, a first electrode of the second transistor is connected to the second electrode of the third transistor, and a second electrode of the second transistor is connected to the sensing signal line;
a first electrode of the storage capacitor serves as the first terminal of the storage circuit, and a second electrode of the storage capacitor serves as the second terminal of the storage circuit;
the storage capacitor comprises two capacitor plates which are stacked, one of the two capacitor plates serves as the first electrode of the storage capacitor and the other of the two capacitor plates serves as the second electrode of the storage capacitor; and
an orthographic projection of at least one of the two capacitor plates on the base substrate at least partially covers an orthographic projection of the first transistor on the base substrate, and at least partially covers an orthographic projection of the second transistor on the base substrate.

2. The display substrate according to claim 1, wherein an amount of pixel units comprised in each group of pixel units is N, N is a positive integer, the light-emitting control circuit comprises N light-emitting control sub-circuits, and the at least two light-emitting control signals comprise N light-emitting control signals, each light-emitting control sub-circuit is connected to a light-emitting element of one pixel unit in the corresponding group of pixel units, each light-emitting control sub-circuit receives one light-emitting control signal of the N light-emitting control signals, different light-emitting control sub-circuits are connected to light-emitting elements of different pixel units in the corresponding group of pixel units, and different light-emitting control sub-circuits receive different light-emitting control signals.

3. The display substrate according to claim 2, wherein a first terminal of the light-emitting element is connected to the light-emitting control circuit, and a second terminal of the light-emitting element receives a second voltage of a second voltage terminal.

4. The display substrate according to claim 3, wherein each light-emitting control sub-circuit comprises a light-emitting control transistor, a gate electrode of the light-emitting control transistor is connected to a corresponding light-emitting control signal line to receive a corresponding light-emitting control signal, a first electrode of the light-emitting control transistor is connected to the second electrode of the third transistor, and a second electrode of the light-emitting control transistor is connected to a corresponding light-emitting element.

5. The display substrate according to claim 4, wherein the orthographic projection of the first transistor on the base substrate at least comprises an orthographic projection of an active layer of the first transistor on the base substrate, and the orthographic projection of the second transistor on the base substrate at least comprises an orthographic projection of an active layer of the second transistor on the base substrate.

6. The display substrate according to claim 4, wherein the orthographic projection of at least one of the two capacitor plates on the base substrate at least partially covers an orthographic projection of the third transistor on the base substrate.

7. The display substrate according to claim 4, wherein the orthographic projection of the first transistor on the base substrate and the orthographic projection of the second transistor on the base substrate are on different sides of an orthographic projection of the third transistor on the base substrate.

8. The display substrate according to claim 4, wherein the orthographic projection of at least one of the two capacitor plates on the base substrate at least partially covers an orthographic projection of the light-emitting control transistor on the base substrate.

9. The display substrate according to claim 4, wherein the two capacitor plates comprise a first capacitor plate and a second capacitor plate, and an orthographic projection of the second capacitor plate on the base substrate covers an orthographic projection of the first capacitor plate on the base substrate;

the first capacitor plate is connected to a first transfer electrode through a first group of via holes, and an orthographic projection of the first transfer electrode on the base substrate and orthographic projections of the first group of via holes on the base substrate are all located within the orthographic projection of the first capacitor plate on the base substrate; and the second capacitor plate is connected to a second transfer electrode through a second group of via holes, and an orthographic projection of the second transfer electrode on the base substrate and orthographic projections of the second group of via holes on the base substrate are all located within the orthographic projection of the second capacitor plate on the base substrate, and do not overlap with the orthographic projection of the first capacitor plate on the base substrate.

10. The display substrate according to claim 9, wherein there is a gap between the orthographic projection of the second transfer electrode on the base substrate and the orthographic projection of the first capacitor plate on the base substrate.

11. The display substrate according to claim 4, wherein the N light-emitting control sub-circuits comprise a first light-emitting control sub-circuit, a second light-emitting control sub-circuit, a third light-emitting control sub-circuit, and a fourth light-emitting control sub-circuit;

the first light-emitting control sub-circuit comprises a first light-emitting control transistor, the second light-emitting control sub-circuit comprises a second light-emitting control transistor, the third light-emitting control sub-circuit comprises a third light-emitting control transistor, and the fourth light-emitting control sub-circuit comprises a fourth light-emitting control transistor;

the first light-emitting control transistor, the second light-emitting control transistor, the third light-emitting control transistor, and the fourth light-emitting control transistor are distributed along a first direction; and a first via hole connected to a gate electrode of the first light-emitting control transistor, a second via hole connected to a gate electrode of the second light-emitting control transistor, a third via hole connected to a gate electrode of the third light-emitting control transistor, and a fourth via hole connected to a gate electrode of the fourth light-emitting control transistor are not on a same straight line extending along the first direction.

12. The display substrate according to claim 11, wherein a first electrode of the first light-emitting control transistor and a second electrode of the first light-emitting control transistor, a first electrode of the second light-emitting control transistor and a second electrode of the second light-emitting control transistor, a first electrode of the third light-emitting control transistor and a second electrode of the third light-emitting control transistor, and a first electrode of the fourth light-emitting control transistor and a second electrode of the fourth light-emitting control transistor are all on a same extension line extending along the first direction, and the first via hole, the second via hole, the third via hole, and the fourth via hole are alternately on both sides of the extension line.

13. The display substrate according to claim 12, wherein the gate electrode of the first transistor, the gate electrode of the second transistor, and the gate electrode of the third transistor are on a same distribution line extending along the first direction, and the distribution line and the extension line are parallel to each other with a gap.

14. The display substrate according to claim 11, wherein the data line and the sensing signal line are spaced apart from each other and extend in a second direction on the base substrate, and the second direction is perpendicular to the first direction; and
an orthographic projection of the data line on the base substrate and an orthographic projection of the sensing signal line on the base substrate are on different sides of an orthographic projection of the third transistor on the base substrate.

15. The display substrate according to claim 14, wherein the orthographic projection of the data line on the base substrate is between the orthographic projection of the first transistor on the base substrate and the orthographic projection of the third transistor on the base substrate; and
the orthographic projection of the sensing signal line on the base substrate is between the orthographic projection of the second transistor on the base substrate and the orthographic projection of the third transistor on the base substrate.

16. The display substrate according to claim 11, wherein a length of a current flow path between the second light-emitting control transistor and a corresponding light-emitting element and a length of a current flow path between the third light-emitting control transistor and a corresponding light-emitting element are greater than a length of a current flow path between the first light-emitting control transistor and a corresponding light-emitting element and a length of a current flow path between the fourth light-emitting control transistor and a corresponding light-emitting element.

17. A display device, comprising the display substrate according to claim 1.

18. A method for driving the display substrate according to claim 1, wherein the at least two pixel units comprised in each group of pixel units comprise a first pixel unit to an N-th pixel unit, the at least two light-emitting control signals comprise a first light-emitting control signal to an N-th light-emitting control signal, one frame of display phase comprises a first phase to an N-th phase, and N is a positive integer; and
the method comprises:
in a P-th phase of the display phase, providing first scanning signals shifted in turn to a plurality of rows of pixel units of the display substrate, and setting a P-th light-emitting control signal of each row of pixel units to be at an operating level, and setting other light-emitting control signals, except the P-th light-emitting control signal, in the at least two light-emitting control signals of each row of pixel units to be at a non-operating level, so as to realize progressive scanning for P-th pixel units in respective groups of pixel units in the P-th phase, wherein $1 \leq P \leq N$ and P is an integer.

* * * * *